US012683737B2

(12) United States Patent
Hu et al.

(10) Patent No.: US 12,683,737 B2
(45) Date of Patent: Jul. 14, 2026

(54) COMMUNICATION METHOD AND COMMUNICATION APPARATUS

(71) Applicant: HUAWEI TECHNOLOGIES CO., LTD., Shenzhen (CN)

(72) Inventors: Mengshi Hu, Shenzhen (CN); Jian Yu, Shenzhen (CN); Ming Gan, Shenzhen (CN); Chenchen Liu, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 288 days.

(21) Appl. No.: 18/409,493

(22) Filed: Jan. 10, 2024

(65) Prior Publication Data

US 2024/0163042 A1 May 16, 2024

Related U.S. Application Data

(63) Continuation of application No. PCT/CN2022/104601, filed on Jul. 8, 2022.

(30) Foreign Application Priority Data

Jul. 12, 2021 (CN) .......................... 202110786868.9

(51) Int. Cl.
*H04L 5/00* (2006.01)
*H03M 13/11* (2006.01)
(Continued)

(52) U.S. Cl.
CPC ....... *H04L 5/0048* (2013.01); *H03M 13/1102* (2013.01); *H04W 72/04* (2013.01); *H04W 72/23* (2023.01)

(58) Field of Classification Search
CPC .............. H03M 13/1102; H04L 1/0057; H04L 27/2602; H04L 5/00; H04L 5/0048;
(Continued)

(56) References Cited

U.S. PATENT DOCUMENTS

2018/0255570 A1* 9/2018 Patil .................... H04W 74/006
2020/0305164 A1* 9/2020 Yang .................... H04L 5/0007
(Continued)

FOREIGN PATENT DOCUMENTS

CN      111669260 A     9/2020
EP      3920590 A1     12/2021

OTHER PUBLICATIONS 802.11a-IEEE Standard for Telecommunications and Information Exchange Between Systems—LAN/MAN Specific Requirements—Part 11: Wireless Medium Access Control (MAC) and physical layer (PHY) specifications: High Speed Physical Layer in the 5 GHz band, LAN/MAN Standards Committee of the IEEE Computer Society, Dec. 30, 1999, total 90 pages.
(Continued)

*Primary Examiner* — Robert J Lopata
(74) *Attorney, Agent, or Firm* — WOMBLE BOND DICKINSON (US) LLP

(57) ABSTRACT

This application provides example communication methods and devices to improve wireless local area network (WLAN) communication efficiency. In an example method, an access point (AP) sends first indication information. The first indication information indicates a first resource unit (RU) of a station (STA). The AP sends second indication information. The second indication information indicates whether the STA is allowed to send a physical layer protocol data unit (PPDU) based on a part of the first RU, and when the second indication information indicates that the STA is allowed to send the PPDU based on the part of the first RU. The PPDU includes a low density parity check (LDPC) extra symbol segment. The AP receives a first PPDU. A second RU occupied by the first PPDU is the part of the first RU. The first PPDU includes the LDPC extra symbol segment.

9 Claims, 13 Drawing Sheets

(51) Int. Cl.
  H04W 72/04 (2023.01)
  H04W 72/23 (2023.01)

(58) Field of Classification Search
  CPC ... H04L 5/0053; H04L 5/0091; H04L 5/0094;
      H04W 72/04; H04W 72/23; H04W 84/12
  USPC ........................................................ 370/329
  See application file for complete search history.

(56) References Cited

U.S. PATENT DOCUMENTS

| | | | | |
|---|---|---|---|---|
| 2021/0212035 | A1 | 7/2021 | Son et al. | |
| 2021/0281372 | A1* | 9/2021 | Liu | H04W 72/23 |
| 2022/0030604 | A1* | 1/2022 | Noh | H04W 72/121 |
| 2023/0198696 | A1* | 6/2023 | Huang | H04L 1/0003 |
| | | | | 370/329 |
| 2023/0413367 | A1* | 12/2023 | Huang | H04L 5/0023 |
| 2024/0187157 | A1* | 6/2024 | Yang | H04L 5/0044 |
| 2024/0313888 | A1* | 9/2024 | Park | H04L 1/0041 |

OTHER PUBLICATIONS 802.11b-1999-IEEE Standard for Information Technology—Telecommunications and information exchange between systems—Local and Metropolitan networks—Specific requirements—Part 11: Wireless LAN Medium Access Control (MAC) and Physical Layer (PHY) specifications: Higher Speed Physical Layer (PHY) Extension in the 2.4 GHz band, LAN/MAN Standards Committeeof theIEEE Computer Society, Sep. 16, 1999, total 97 pages.
802.11g-IEEE Standard for Information technology—Local and metropolitan area networks—Specific requirements—Part 11: Wireless LAN Medium Access Control (MAC) and Physical Layer (PHY) Specifications: Further Higher Data Rate Extension in the 2.4 GHz Band, LAN/MAN Standards Committee of the IEEE Computer Society, Jun. 12, 2003, total 77 pages.
802.11n-IEEE Standard for Information technology—Local and metropolitan area networks—Specific requirements—Part 11: Wireless LAN Medium Access Control (MAC)and Physical Layer (PHY) Specifications Amendment 5: Enhancements for Higher Throughput, IEEE Computer Society, Sep. 11, 2009, total 536 pages.
802.11ac-IEEE Standard for Information technology—Telecommunications and information exchange between systems Local and metropolitan area networks—Specific requirements Part 11: Wireless LAN Medium Access Control (MAC) and Physical Layer (PHY) Specifications Amendment 4: Enhancements for Very High Throughput for Operation in Bands below 6 Ghz, IEEE Computer Society, Dec. 11, 2013, total 425 pages.
IEEE P802.11ax/D8.0 Draft Standard for Information technology—Telecommunications and information exchange between systems Local and metropolitan area networks—Specific requirements Part 11: Wireless LAN Medium Access Control (MAC) and Physical Layer (PHY) Specifications Amendment 1: Enhancements for High Efficiency WLAN, LAN/MAN Standards Committee of the IEEE Computer Society, Oct. 2020, total 820 pages.
IEEE P802.11be/D0.4 Draft Standard for Information technology—Telecommunications and information exchange between systems Local and metropolitan area networks—Specific requirements Part 11: Wireless LAN Medium Access Control (MAC) and Physical Layer (PHY) Specifications Amendment 8: Enhancements for extremely high throughput (EHT), LAN/MAN Standards Committee of the IEEE Computer Society, Mar. 2021, total 511 pages.
Insun Jang et al, Discussion on EHT Trigger based UL MU, IEEE 802.11-20/0413r1, Mar. 16, 2020, total 13 pages.
Yanyi Ding et al., RU Adaptation in TB UL MU Transmission, IEEE 802.11-20/1886r1, Nov. 27, 2020, total 8 pages.

* cited by examiner

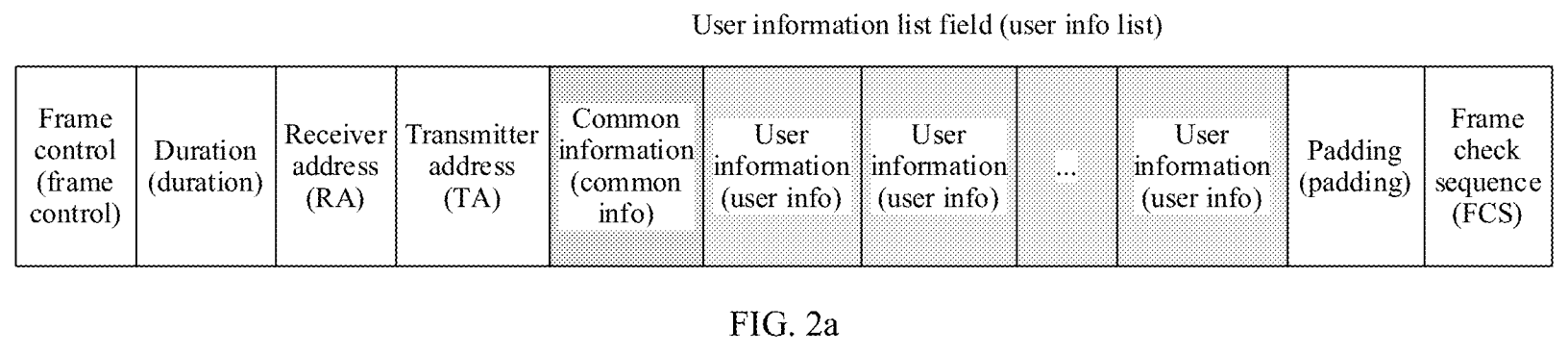

User information list field (user info list)

| Frame control (frame control) | Duration (duration) | Receiver address (RA) | Transmitter address (TA) | Common information (common info) | User information (user info) | User information (user info) | ... | User information (user info) | Padding (padding) | Frame check sequence (FCS) |
|---|---|---|---|---|---|---|---|---|---|---|

FIG. 2a

User information list field

| User Info (STA 1) User information | ... | User Info (STA M) |

Common information field

| Trigger Type Trigger frame type | UL Length Uplink length | More TF More trigger frame | CS Required Carrier sensing required | UL Bandwidth Uplink bandwidth | GI And HE-LTF Type Guard interval and HE long training sequence type | MU-MIMO HE-LTF Mode MU-MIMO HE-LTF Mode | Number of HE-LTF Symbols And Midamble Periodicity Number of HE-LTFs and midamble periodicity | UL STBC Uplink space-time block coding |

| LDPC Extra Symbol Segment | AP TX Power AP transmit power | Pre-FEC Padding Factor Pre-forward error correction padding factor | PE Disambiguilty Packet extension disambiguity | UL Spatial Reuse Uplink spatial reuse | Doppler Doppler | UL HE-SIG-A2 Reserved Uplink HE-SIG-A2 reserved | Reserved Reserved | Trigger frame type-based common information Trigger Dependent Common Info |

| AID12 Association identifier | RU Allocation Resource unit allocation | UL FEC Coding Type Uplink forward error correction coding type | UL HE-MCS Modulation and coding scheme | UL DCM Uplink dual carrier modulation | SS Allocation/RA-RU Information Spatial stream allocation/random access RU information | UL Target RSSI Uplink target received signal strength indicator | Reserved Reserved | Trigger frame type-based station information Trigger Dependent User Info |

FIG. 2b

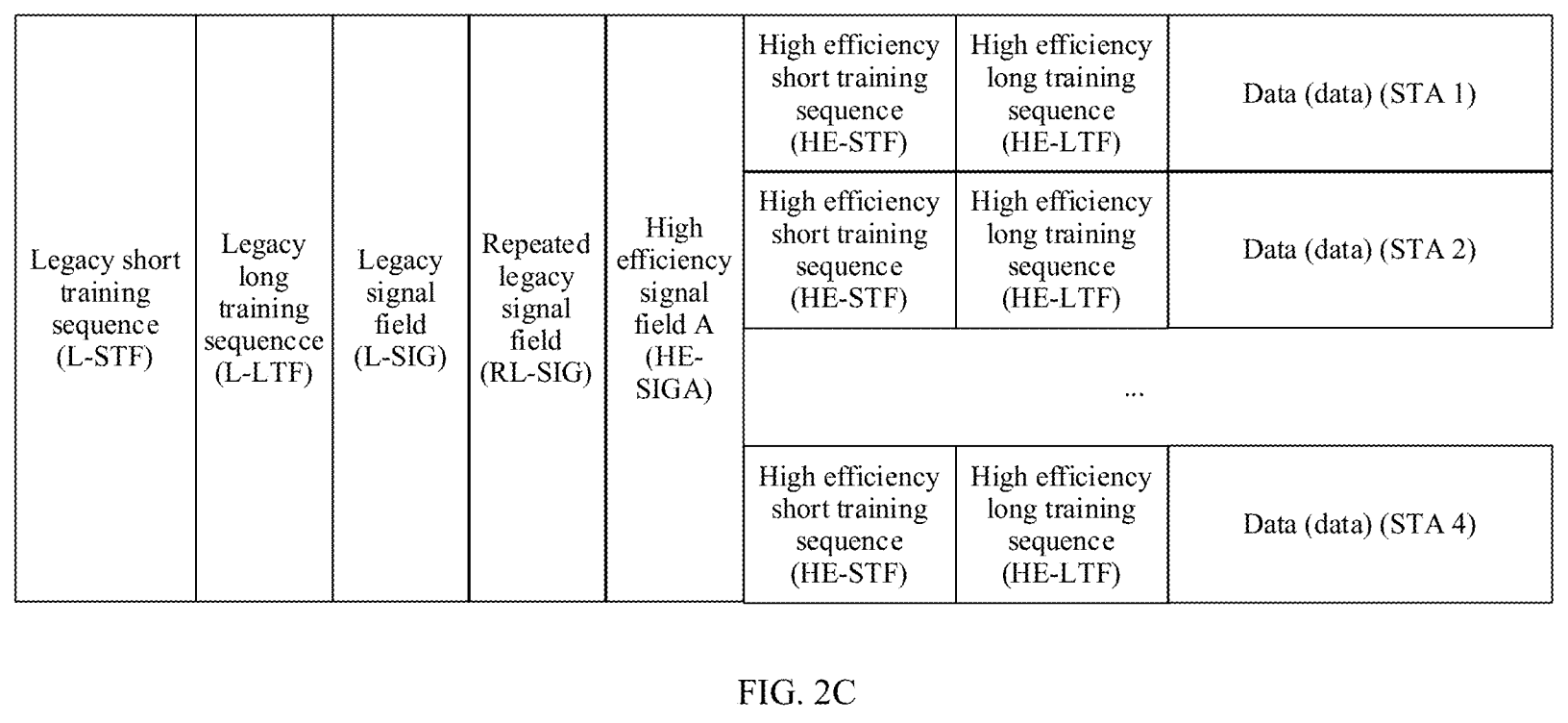

| Legacy short training sequence (L-STF) | Legacy long training sequencce (L-LTF) | Legacy signal field (L-SIG) | Repeated legacy signal field (RL-SIG) | High efficiency signal field A (HE-SIGA) | High efficiency short training sequence (HE-STF) | High efficiency long training sequence (HE-LTF) | Data (data) (STA 1) |
| | | | | | High efficiency short training sequence (HE-STF) | High efficiency long training sequence (HE-LTF) | Data (data) (STA 2) |
| | | | | | ... | | |
| | | | | | High efficiency short training sequence (HE-STF) | High efficiency long training sequence (HE-LTF) | Data (data) (STA 4) |

FIG. 2C

CONT. FROM FIG. 2d-1

AP

STA

S501: Generate a trigger frame

S502: Send the trigger frame

S503: Send a PPDU based on the
trigger frame, where the PPDU
includes fourth indication information

1100

Communication apparatus

1101

Transceiver unit 11011                          11012

Sending unit            Receiving unit

1102

Processing unit

COMMUNICATION METHOD AND COMMUNICATION APPARATUS

CROSS-REFERENCE TO RELATED APPLICATIONS

This application is a continuation of International Application No. PCT/CN2022/104601, filed on Jul. 8, 2022, which claims priority to Chinese Patent Application No. 202110786868.9, filed on Jul. 12, 2021. The disclosures of the aforementioned applications are hereby incorporated by reference in their entireties.

TECHNICAL FIELD

This application relates to the field of wireless local area network (WLAN) technologies, and in particular, to a communication method and a communication apparatus.

BACKGROUND

WLAN communication technologies have been through development of various generations, including 802.11a/b/g, 802.11n, 802.11ac, 802.11ax, and 802.11be (which may also be referred to as an extremely high throughput (EHT) standard) that is under discussion, and the like, in an order of release time of communication standards. In WLAN communication, an uplink resource of a station (STA) is usually allocated by an access point (AP), and to-be-sent data of the STA needs to be coded before being transmitted on an uplink resource specified by the AP.

In a WLAN uplink resource allocation process, in a previous uplink resource allocation manner of the EHT, only one resource unit (RU) is allowed to be allocated to each STA. However, in a different uplink resource allocation manner of the EHT, an RU or multiple resource units (MRU) can be allocated to each STA. In addition, the EHT may further subsequently allow the STA to perform transmission based on a part of an RU or MRU (which may also be referred to as an adaptive RU (or adapted RU)).

In a WLAN encoding process, for example, in 802.11n, low density parity check (LDPC) encoding needs to be performed on to-be-sent data bits of the STA, to obtain coded data. The coded data includes at least the data bits and parity bits, and the parity bits may further be punctured. When the parity bits are punctured, to ensure that there are sufficient parity bits to support the AP in performing checking, when a number of parity bits that are deleted in a puncturing process is large, it is stipulated in 802.11n that parity bits that should be deleted may be carried based on a new transmission symbol. Because a number of tones carried in each symbol in the EHT is large, in the EHT, the deleted parity bits are carried based on a symbol segment instead, to reduce overheads. In addition, in a process of allocating the uplink resource, the AP may further specify, for the STA, whether the STA performs transmission based on the symbol segment.

However, in the foregoing implementation in which the AP specifies whether the STA performs transmission based on the symbol segment, the AP performs the specifying based on an RU or MRU that is allocated to the STA. However, when the STA performs transmission based on the adaptive RU, because a number of bits carried in a PPDU transmitted based on the adaptive RU is different from a number of bits carried in a PPDU transmitted based on a complete RU or MRU, the implementation, of the STA, based on the specification does not adapt to transmission performed by the STA on the adaptive RU. This reduces communication efficiency.

SUMMARY

Embodiments of this application provide a communication method and a communication apparatus, to improve WLAN communication efficiency.

A first aspect of embodiments of this application provides a communication method, applied to WLAN communication. The method is performed by an AP, or the method is performed by some components (such as a processor, a chip, or a chip system) in the AP. In the method, an AP sends first indication information, where the first indication information indicates a first RU of a STA; the AP sends second indication information, where the second indication information indicates whether the STA is allowed to send a physical layer protocol data unit (PPDU) based on a part of the first RU, and when the second indication information indicates that the STA is allowed to send the PPDU based on the part of the first RU, the PPDU includes an LDPC extra symbol segment; and the AP receives a first PPDU, where a second RU occupied by the first PPDU is the part of the first RU, and the first PPDU includes the LDPC extra symbol segment.

According to the foregoing technical solution, the second indication information sent by the AP indicates whether the STA is allowed to send the PPDU based on the allocated part of the first RU, and when the second indication information indicates that the STA is allowed to send the PPDU based on the part of the first RU, the PPDU includes the LDPC extra symbol segment. In other words, when the STA sends the PPDU based on the part of the first RU that is allocated by the first indication information, the PPDU is configured based on the LDPC extra symbol segment, so that the STA performs transmission on an adaptive RU based on the LDPC extra symbol segment. Therefore, a case is avoided in which when the AP specifies that the STA does not perform transmission based on a symbol segment, decoding performance is reduced on an AP side because the STA does not adapt to the specification when performing transmission on the adaptive RU. This improves WLAN communication efficiency.

In an embodiment, the second indication information may be represented as an adaptive RU allowed field, or the second indication information may be represented as an adaptive RU allowed subfield, or the second indication information may be represented as an adaptive TB PPDU allowed field, or the second indication information may be represented as an adaptive TB PPDU allowed subfield.

It should be noted that "when the second indication information indicates that the STA is allowed to send the PPDU based on the part of the first RU, the PPDU includes the LDPC extra symbol segment" may indicate that when the second indication information indicates that the STA is allowed to send the PPDU based on the part of the first RU and when the STA sends the PPDU based on the part of the first RU, the PPDU includes the LDPC extra symbol segment; may alternatively indicate that the second indication information indicates that the STA is allowed to send the PPDU based on the part of the first RU and the PPDU includes the LDPC extra symbol segment; and may alternatively indicate that the second indication information indicates that the STA is allowed to send the PPDU based on the part of the first RU and the second indication information further indicates that the PPDU includes the LDPC extra symbol segment.

In an embodiment of the first aspect, after the AP receives the first PPDU, the method further includes: First, the AP determines a configuration manner of the first PPDU based on a size of the first PPDU, and the configuration manner includes configuring the first PPDU based on a manner in which an LDPC extra symbol segment exists. Then, the AP parses the PPDU based on the configuration manner.

In an embodiment, that the AP parses the PPDU based on the configuration manner may also means that the AP decodes the PPDU based on the configuration manner.

According to the foregoing technical solution, after receiving the first PPDU from the STA, the AP may further determine, based on the size of the first PPDU, that the configuration manner of the first PPDU is configuring the first PPDU based on the manner in which an LDPC extra symbol segment exists, so that the AP parses the first PPDU based on the configuration manner. The AP is prevented from parsing the first PPDU based on a configuration manner that is not based on a manner in which an LDPC extra symbol segment exists. This improves a success rate of parsing the first PPDU on the AP side, and further improves communication efficiency.

A second aspect of embodiments of this application provides a communication method, applied to WLAN communication. The method is performed by a STA, or the method is performed by some components (such as a processor, a chip, or a chip system) in the STA. In the method, a STA receives first indication information, where the first indication information indicates a first RU of the STA; the STA receives second indication information, where the second indication information indicates whether the STA is allowed to send a PPDU based on a part of the first RU, and when the second indication information indicates that the STA is allowed to send the PPDU based on the part of the first RU, the PPDU includes an LDPC extra symbol segment; and the STA sends the first PPDU based on the first indication information and the second indication information, where a second RU occupied by the first PPDU is the part of the first RU, and the first PPDU includes the LDPC extra symbol segment.

According to the foregoing technical solution, the second indication information received by the STA indicates whether the STA is allowed to send the PPDU based on the allocated part of the first RU, and when the second indication information indicates that the STA is allowed to send the PPDU based on the part of the first RU, the PPDU includes the LDPC extra symbol segment. In other words, when the STA sends the PPDU based on the part of the first RU that is allocated by the first indication information, the PPDU is configured based on the LDPC extra symbol segment, so that the STA performs transmission on an adaptive RU based on the LDPC extra symbol segment. Therefore, a case is avoided in which when the AP specifies that the STA does not perform transmission based on a symbol segment, decoding performance is reduced on an AP side because the STA does not adapt to the specification when performing transmission on the adaptive RU. This improves WLAN communication efficiency.

In an embodiment of the first aspect or the second aspect, the first indication information is carried in a trigger frame, the trigger frame further includes third indication information, and the third indication information indicates that an LDPC extra symbol segment exists.

According to the foregoing technical solution, the first indication information that indicates the first RU of the STA to the STA is carried in the trigger frame, and the trigger frame further includes the third indication information that indicates that an LDPC extra symbol segment exists, so that a plurality of pieces of indication information are carried in a same trigger frame. This reduces overheads and further improves communication efficiency.

In an embodiment, the third indication information includes an LDPC extra symbol segment subfield (e.g., LDPC Extra Symbol Segment), and when a value of the LDPC extra symbol segment subfield is 1, it indicates that an LDPC extra symbol segment exists.

In an embodiment of the first aspect or the second aspect, the trigger frame is carried in the second PPDU, and the second indication information is carried in the second PPDU.

According to the foregoing technical solution, the trigger frame that includes the first indication information and the third indication information is carried in the second PPDU, and the second indication information that indicates whether the STA is allowed to send the PPDU based on the allocated part of the first RU is also carried in the second PPDU, so that the plurality of pieces of indication information are carried in the same PPDU. This reduces overheads and further improves communication efficiency.

In an embodiment, the second indication information is carried in the trigger frame.

In an embodiment, the second PPDU includes the first indication information that is different from the trigger frame, and the second indication information is carried in the first indication information. The first indication information may be a control frame, a management frame, information in a preamble, or the like. This is not limited herein.

A third aspect of embodiments of this application provides a communication method, applied to WLAN communication. The method is performed by a STA, or the method is performed by some components (such as a processor, a chip, or a chip system) in the STA. In the method, a STA receives a trigger frame, where the trigger frame includes first indication information and third indication information, the first indication information indicates a first RU of the STA, and the third indication information indicates whether an LDPC extra symbol segment exists; and the STA determines a second RU based on the trigger frame, where second RU is a part of the first RU, when the third indication information indicates that an LDPC extra symbol segment does not exist and when the first PPDU is sent based on the second RU, the first PPDU is a PPDU that does not require an LDPC extra symbol segment.

According to the foregoing technical solution, the trigger frame received by the STA includes the first indication information that indicates the first RU of the STA and the third indication information that indicates whether an LDPC extra symbol segment exists. When the STA transmits the first PPDU based on the part that is of the first RU and that is determined by using the trigger frame, the first PPDU is a PPDU that does not require an LDPC extra symbol segment. In other words, when the STA selects an adaptive RU based on the allocated first RU, the STA selects an adaptive RU corresponding to the PPDU that does not require an LDPC extra symbol segment, and transmits the first PPDU based on the adaptive RU. Therefore, a case is avoided in which when the AP specifies that the STA does not perform transmission based on a symbol segment, decoding performance is reduced on an AP side because the STA does not adapt to the specification when performing transmission on the adaptive RU, so that the STA adapts to the specification of the AP when the STA transmits the PPDU based on the adaptive RU. This improves WLAN communication efficiency.

A fourth aspect of embodiments of this application provides a communication method, applied to WLAN communication. The method is performed by an AP, or the method is performed by some components (such as a processor, a chip, or a chip system) in the AP. In the method, an AP generates a trigger frame, where the trigger frame includes first indication information and third indication information, the first indication information indicates a first RU of a STA, and the third indication information indicates whether an LDPC extra symbol segment exists; and the AP sends the trigger frame.

According to the foregoing technical solution, the trigger frame generated and sent by the AP includes the first indication information that indicates the first RU of the STA and the third indication information that indicates whether the LDPC extra symbol segment exists. When the STA sends the first PPDU based on the part that is of the first RU and that is determined by using the trigger frame and when the third indication information indicates that an LDPC extra symbol segment does not exist, the first PPDU is a PPDU that does not require an LDPC extra symbol segment. In other words, when the STA selects an adaptive RU based on the allocated first RU, the STA selects an adaptive RU corresponding to the PPDU that does not require an LDPC extra symbol segment, and transmits the first PPDU based on the adaptive RU. Therefore, a case is avoided in which when the AP specifies that the STA does not perform transmission based on a symbol segment, decoding performance is reduced on an AP side because the STA does not adapt to the specification when performing transmission on the adaptive RU, so that the STA adapts to the specification of the AP when the STA transmits the PPDU based on the adaptive RU. This improves WLAN communication efficiency.

A fifth aspect of embodiments of this application provides a communication method, applied to WLAN communication. The method is performed by a STA, or the method is performed by some components (such as a processor, a chip, or a chip system) in the STA. In the method, a STA receives a trigger frame, where the trigger frame includes first indication information, and the first indication information indicates a first RU of the STA; and the STA sends a first PPDU based on a second RU that is determined by using the trigger frame, where the first PPDU includes an LDPC extra symbol segment, and the second RU is a part of the first RU.

According to the foregoing technical solution, the trigger frame received by the STA includes the first indication information that indicates the first RU of the STA. When the STA transmits the first PPDU based on the second RU that is determined by using the trigger frame, the first PPDU includes the LDPC extra symbol segment, and the second RU is the part of the first RU. In other words, when the STA selects the second RU as an adaptive RU based on the allocated first RU, the first PPDU transmitted by the STA on the adaptive RU includes the LDPC extra symbol segment. Therefore, a case is avoided in which when the AP specifies whether the STA performs transmission based on a symbol segment, communication efficiency is low because the STA does not adapt to the specification when performing transmission on the adaptive RU, so that the PPDU transmitted by the STA based on the adaptive RU includes the LDPC extra symbol segment. This improves WLAN communication efficiency.

A sixth aspect of embodiments of this application provides a communication method, applied to WLAN communication. The method is performed by an AP, or the method is performed by some components (such as a processor, a chip, or a chip system) in the AP. In the method, an AP generates a trigger frame, where the trigger frame includes first indication information, and the first indication information indicates a first RU of a STA; and the AP receives a first PPDU based on a second RU that is determined by using the trigger frame, where the first PPDU includes an LDPC extra symbol segment, and the second RU is a part of the first RU.

According to the foregoing technical solution, the trigger frame generated and sent by the AP includes the first indication information that indicates the first RU of the STA. Then, when the AP receives the first PPDU based on the second RU that is determined by using the trigger frame, that is, when the STA transmits the first PPDU based on the second RU that is determined by using the trigger frame, the first PPDU includes the LDPC extra symbol segment, and the second RU is the part of the first RU. In other words, when the STA selects the second RU as an adaptive RU based on the allocated first RU, the first PPDU transmitted by the STA on the adaptive RU includes the LDPC extra symbol segment. Therefore, a case is avoided in which when the AP specifies whether the STA performs transmission based on a symbol segment, communication efficiency is low because the STA does not adapt to the specification when performing transmission on the adaptive RU, so that the PPDU transmitted by the STA based on the adaptive RU includes the LDPC extra symbol segment. This improves WLAN communication efficiency.

In an embodiment of any one of the first aspect to the sixth aspect, the first PPDU includes fourth indication information, and the fourth indication information indicates whether the first PPDU includes the LDPC extra symbol segment.

According to the foregoing technical solution, after receiving a first PPDU from the STA, the AP may further determine, based on the fourth indication information in the first PPDU, whether the configuration manner of the first PPDU includes the LDPC extra symbol segment, so that the AP subsequently parses the first PPDU based on the fourth indication information. This improves a success rate of parsing the first PPDU on the AP side, and further improves communication efficiency.

In an embodiment of any one of the first aspect to the sixth aspect, the LDPC extra symbol segment includes an extra symbol segment of a post-forward error correction padding (post-FEC padding) type.

According to the foregoing technical solution, symbol segments used in the EHT include different types. A difference between a current implementation in which only an extra symbol segment of a pre-forward error correction padding (pre-FEC padding) type may be used in the EHT and the foregoing technical solution lies in that, in the foregoing technical solution, the LDPC extra symbol segment is further extended, so that the extra symbol segment of the post-FEC padding type may be used. This further improves communication efficiency.

In an embodiment, the LDPC extra symbol segment includes an extra symbol segment of a pre-FEC padding type.

In an embodiment of any one of the first aspect to the sixth aspect, the first RU is an RU or MRU.

According to the foregoing technical solution, the first RU indicated by the AP by using the first indication information may be an RU, or may be an MRU, so that the solution is applicable to different RU allocation scenarios.

A seventh aspect of embodiments of this application provides a communication apparatus that includes a sending unit and a receiving unit.

The sending unit is configured to send first indication information, where the first indication information indicates a first RU of a STA;

the sending unit is further configured to send second indication information, where the second indication information indicates whether the STA is allowed to send a PPDU based on a part of the first RU, and when the second indication information indicates that the STA is allowed to send the PPDU based on the part of the first RU, the PPDU includes an LDPC extra symbol segment; and the receiving unit is configured to receive a first PPDU, where a second RU occupied by the first PPDU is the part of the first RU, and the first PPDU includes the LDPC extra symbol segment.

According to the foregoing technical solution, the second indication information sent by the sending unit indicates whether the STA is allowed to send the PPDU based on the allocated part of the first RU, and when the second indication information indicates that the STA is allowed to send the PPDU based on the part of the first RU, the PPDU includes the LDPC extra symbol segment. In other words, when the STA sends the PPDU based on the part of the first RU that is allocated by the first indication information, the PPDU is configured based on the LDPC extra symbol segment, so that the STA performs transmission on an adaptive RU based on the LDPC extra symbol segment. Therefore, a case is avoided in which when the AP specifies that the STA does not perform transmission based on a symbol segment, decoding performance is reduced on an AP side because the STA does not adapt to the specification when performing transmission on the adaptive RU. This improves WLAN communication efficiency.

In an embodiment of the seventh aspect, the apparatus further includes a processing unit, and the processing unit is specifically configured to:

after the receiving unit receives the first PPDU, determine a configuration manner of the first PPDU based on a size of the first PPDU, where the configuration manner includes configuring the first PPDU based on a manner in which an LDPC extra symbol segment exists; and parse the PPDU based on the configuration manner.

An eighth aspect of embodiments of this application provides a communication apparatus that includes a sending unit and a receiving unit.

The receiving unit is configured to receive first indication information, where the first indication information indicates a first RU of a STA;

the receiving unit is further configured to receive second indication information, where the second indication information indicates whether the STA is allowed to send a PPDU based on a part of the first RU, and when the second indication information indicates that the STA is allowed to send the PPDU based on the part of the first RU, the PPDU includes an LDPC extra symbol segment; and the sending unit is configured to send the first PPDU based on the first indication information and the second indication information, where a second RU occupied by the first PPDU is the part of the first RU, and the first PPDU includes the LDPC extra symbol segment.

According to the foregoing technical solution, the second indication information received by the receiving unit indicates whether the STA is allowed to send the PPDU based on the allocated part of the first RU, and when the second indication information indicates that the STA is allowed to send the PPDU based on the part of the first RU, the PPDU includes the LDPC extra symbol segment. In other words, when the sending unit sends the PPDU based on the part of the first RU that is allocated by the first indication information, the PPDU is configured based on the LDPC extra symbol segment, so that the STA performs transmission on an adaptive RU based on the LDPC extra symbol segment. Therefore, a case is avoided in which when the AP specifies that the STA does not perform transmission based on a symbol segment, decoding performance is reduced on an AP side because the STA does not adapt to the specification when performing transmission on the adaptive RU. This improves WLAN communication efficiency.

In an embodiment of the seventh aspect or the eighth aspect, the first indication information is carried in a trigger frame, the trigger frame further includes third indication information, and the third indication information indicates that an LDPC extra symbol segment exists.

In an embodiment of the seventh aspect or the eighth aspect, the trigger frame is carried in a second PPDU, and the second indication information is carried in the second PPDU.

A ninth aspect of embodiments of this application provides a communication apparatus that includes a transceiver unit and a processing unit.

The transceiver unit is configured to receive a trigger frame, where the trigger frame includes first indication information and third indication information, the first indication information indicates a first RU of a STA, and the third indication information indicates whether an LDPC extra symbol segment exists; and the processing unit is configured to determine a second RU based on the trigger frame, where the second RU is a part of the first RU, and when the third indication information indicates that an LDPC extra symbol segment does not exist and when the first PPDU is sent based on the second RU, the first PPDU is a PPDU that does not require an LDPC extra symbol segment.

According to the foregoing technical solution, the trigger frame received by the transceiver unit includes the first indication information that indicates the first RU of the STA and the third indication information that indicates whether the LDPC extra symbol segment exists. Then, when the processing unit transmits the first PPDU based on the part that is of the first RU and that is determined by using the trigger frame, and when the third indication information indicates that an LDPC extra symbol segment does not exist, the first PPDU is the PPDU that does not require an LDPC extra symbol segment. In other words, when the processing unit selects an adaptive RU based on the allocated first RU, the processing unit selects an adaptive RU corresponding to the PPDU that does not require an LDPC extra symbol segment, and transmits the first PPDU based on the adaptive RU. Therefore, a case is avoided in which, when the AP specifies that the STA does not perform transmission based on a symbol segment, decoding performance is reduced on an AP side because the STA does not adapt to the specification when performing transmission on the adaptive RU, so that the STA adapts to the specification of the AP when the STA transmits the PPDU based on the adaptive RU. This improves WLAN communication efficiency.

A tenth aspect of embodiments of this application provides a communication apparatus that includes a transceiver unit and a processing unit.

The processing unit is configured to generate a trigger frame, where the trigger frame includes first indication information and third indication information, the first indication information indicates a first RU of a STA, and the third indication information indicates whether an LDPC extra symbol segment exists; and the transceiver unit is configured to send the trigger frame.

According to the foregoing technical solution, the trigger frame generated and sent by the processing unit includes the first indication information that indicates the first RU of the STA and the third indication information that indicates whether the LDPC extra symbol segment exists. Then, when the STA transmits the first PPDU based on the part that is of the first RU and that is determined by using the trigger frame, the first PPDU is a PPDU that does not require an LDPC extra symbol segment. In other words, when the STA selects an adaptive RU based on the allocated first RU, the STA selects an adaptive RU corresponding to the PPDU that does not require an LDPC extra symbol segment, and transmits the first PPDU based on the adaptive RU. Therefore, a case is avoided in which when the AP specifies that the STA does not perform transmission based on a symbol segment, decoding performance is reduced on an AP side because the STA does not adapt to the specification when performing transmission on the adaptive RU, so that the STA adapts to the specification of the AP when the STA transmits the PPDU based on the adaptive RU. This improves WLAN communication efficiency.

An eleventh aspect of embodiments of this application provides a communication apparatus that includes a transceiver unit and a processing unit.

The transceiver unit is configured to receive a trigger frame, where the trigger frame includes first indication information, and the first indication information indicates a first RU of a STA; and the processing unit is configured to send a first PPDU based on a second RU that is determined by using the trigger frame, where the first PPDU includes an LDPC extra symbol segment, and the second RU is a part of the first RU.

According to the foregoing technical solution, the trigger frame received by the transceiver unit includes the first indication information that indicates the first RU of the STA. Then, when the processing unit transmits the first PPDU based on the second RU that is determined by using the trigger frame, the first PPDU includes the LDPC extra symbol segment, and the second RU is the part of the first RU. In other words, when the STA selects the second RU as an adaptive RU based on the allocated first RU, the first PPDU transmitted by the STA on the adaptive RU includes the LDPC extra symbol segment. Therefore, a case is avoided in which when the AP specifies whether the STA performs transmission based on a symbol segment, communication efficiency is low because the STA does not adapt to the specification when performing transmission on the adaptive RU, so that the PPDU transmitted by the STA based on the adaptive RU includes the LDPC extra symbol segment. This improves WLAN communication efficiency.

A twelfth aspect of embodiments of this application provides a communication apparatus that includes a transceiver unit and a processing unit.

The processing unit is configured to generate a trigger frame, where the trigger frame includes first indication information, and the first indication information indicates a first RU of a STA; and the transceiver unit is configured to receive a first PPDU based on a second RU that is determined by using the trigger frame, where the first PPDU includes an LDPC extra symbol segment, and the second RU is a part of the first RU.

According to the foregoing technical solution, the trigger frame generated and sent by the processing unit includes the first indication information that indicates the first RU of the STA. Then, when the transceiver unit receives the first PPDU based on the second RU that is determined by using the trigger frame, that is, when the STA transmits the first PPDU based on the second RU that is determined by using the trigger frame, the first PPDU includes the LDPC extra symbol segment, and the second RU is the part of the first RU. In other words, when the STA selects the second RU as an adaptive RU based on the allocated first RU, the first PPDU transmitted by the STA on the adaptive RU includes the LDPC extra symbol segment. Therefore, a case is avoided in which when the AP specifies whether the STA performs transmission based on a symbol segment, communication efficiency is low because the STA does not adapt to the specification when performing transmission on the adaptive RU, so that the PPDU transmitted by the STA based on the adaptive RU includes the LDPC extra symbol segment. This improves WLAN communication efficiency.

In an embodiment of any one of the seventh aspect to the twelfth aspect, the first PPDU includes fourth indication information, and the fourth indication information indicates whether the first PPDU includes the LDPC extra symbol segment.

In an embodiment of any one of the seventh aspect to the twelfth aspect, the LDPC extra symbol segment includes an extra symbol segment of a post-forward error correction padding post-FEC padding type.

In an embodiment of any one of the seventh aspect to the twelfth aspect, the first RU is an RU or MRU.

It should be noted that the communication apparatus provided in the seventh aspect to the twelfth aspect may further perform the communication method according to any one of the first aspects to the sixth aspect and embodiments of the first aspect to the sixth aspect, and implement corresponding beneficial effects.

A thirteenth aspect of embodiments of this application provides a communication apparatus that includes at least one processor. The at least one processor is coupled to a memory.

The memory is configured to store a program or instructions.

The at least one processor is configured to execute the program or instructions, so that the apparatus implements the method according to any one of the first aspect or embodiments of the first aspect, or the apparatus implements the method according to any one of the second aspect or embodiments of the second aspect, or the apparatus implements the method according to any one of the third aspect or embodiments of the third aspect, or the apparatus implements the method according to any one of the fourth aspect or embodiments of the fourth aspect, or the apparatus implements the method according to any one of the fifth aspect or embodiments of the fifth aspect, or the apparatus implements the method according to any one of the sixth aspect or embodiments of the sixth aspect.

A fourteenth aspect of embodiments of this application provides a computer-readable storage medium that stores one or more computer-executable instructions. When the computer-executable instructions are executed by a processor, the processor performs the method according to any one of the first aspect or embodiments of the first aspect, or the processor performs the method according to any one of the second aspect or embodiments of the second aspect, or the processor performs the method according to any one of the third aspect or embodiments of the third aspect, or the processor performs the method according to any one of the fourth aspect or embodiments of the fourth aspect, or the processor performs the method according to any one of the fifth aspect or embodiments of the fifth aspect, or the processor performs the method according to any one of the sixth aspect or embodiments of the sixth aspect.

A fifteenth aspect of embodiments of this application provides a computer program product (or referred to as a computer program) that stores one or more computer-executable instructions. When the computer program product is executed by a processor, the processor performs the method according to any one of the first aspect or embodiments of the first aspect, or the processor performs the method according to any one of the second aspect or embodiments of the second aspect, or the processor performs the method according to any one of the third aspect or embodiments of the third aspect, or the processor performs the method according to any one of the fourth aspect or embodiments of the fourth aspect, or the processor performs the method according to any one of fifth aspect or embodiments of the fifth aspect, or the processor performs the method according to any one of the sixth aspect or embodiments of the sixth aspect.

A sixteenth aspect of embodiments of this application provides a chip system. The chip system includes at least one processor, configured to support a communication apparatus in implementing the function in any one of the first aspect or embodiments of the first aspect; or configured to support the communication apparatus in implementing the function in any one of the second aspect or embodiments of the second aspect; or configured to support the communication apparatus in implementing the function in any one of the third aspect or embodiments of the third aspect; or configured to support the communication apparatus in implementing the function in any one of the fourth aspect or embodiments of the fourth aspect; or configured to support the communication apparatus in implementing the function in any one of the fifth aspect or embodiments of the fifth aspect; or configured to support the communication apparatus in implementing the function in any one of the sixth aspect or embodiments of the sixth aspect.

In some embodiments, the chip system further includes a memory. The memory is configured to store program instructions and data that are necessary for the communication apparatus. The chip system may include a chip, or may include a chip and another discrete component. In an embodiment, the chip system further includes an interface circuit, and the interface circuit provides program instructions and/or data for the at least one processor.

A seventeenth aspect of embodiments of this application provides a communication system, where the communication system includes the communication apparatus in the seventh aspect and the communication apparatus in the eighth aspect, and/or the communication system includes the communication apparatus in the ninth aspect and the communication apparatus in the tenth aspect, and/or the communication system includes the communication apparatus in the eleventh aspect and the communication apparatus in the twelfth aspect, and/or the communication system includes the communication apparatus in the thirteenth aspect.

For technical effects brought by any design manner of the seventh aspect to the seventeenth aspect, refer to technical effects brought by different implementations of the first aspect to the sixth aspect. Details are not described herein again.

It can be learned from the foregoing technical solutions that, by using the communication method and the communication apparatus that are provided in the foregoing aspects, a case is avoided in which when the AP specifies that the STA does not perform transmission based on a symbol segment, decoding performance is reduced on an AP side because the STA does not adapt to the specification when performing transmission on the adaptive RU. This improves WLAN communication efficiency.

BRIEF DESCRIPTION OF DRAWINGS

FIG. 2a is a schematic diagram of a trigger frame according to this application;

FIG. 2b is another schematic diagram of a trigger frame according to this application;

FIG. 2c is another schematic diagram of an HE TB PPDU according to this application;

DESCRIPTION OF EMBODIMENTS

Figure 1A:
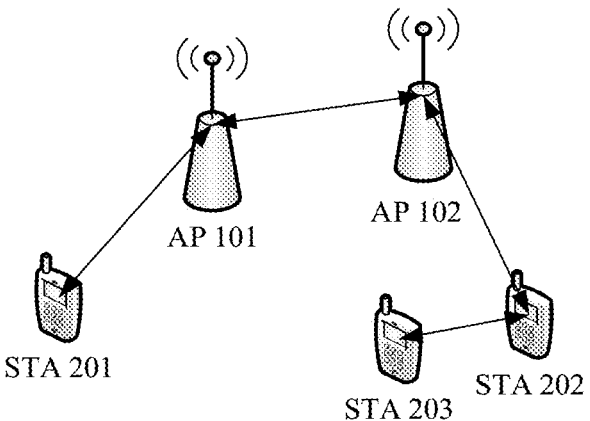
FIG. 1a is a schematic diagram of a communication system to which this application is applied.

The following clearly describes technical solutions in embodiments of this application with reference to the accompanying drawings in embodiments of this application.

In descriptions of this application, unless otherwise specified, "/" means "or". For example, A/B may indicate A or B. The term "and/or" in this specification describes only an association relationship between associated objects and indicates that three relationships may exist. For example, A and/or B may indicate the following three cases: Only A exists, both A and B exist, and only B exists. In addition, "at least one" means one or more, and "a plurality of" means two or more. "At least one of the following items (pieces)" or a similar expression thereof means any combination of these items, including a single item (piece) or any combination of a plurality of items (pieces). For example, at least one of a, b, or c may indicate a, b, c, a and b, a and c, b and c, or a, b, and c, where a, b, and c may be singular or plural.

In descriptions of this application, the terms such as "first" and "second" do not limit a quantity and an execution sequence, and the terms such as "first" and "second" do not indicate a definite difference.

In this application, the terms such as "example" or "for example" are used to give an example, an illustration, or a description. Any embodiment or design scheme described as an "example" or "for example" in this application should not be explained as being more preferred or having more advantages than another embodiment or design scheme. To be precise, the use of the terms "example", "for example", or the like is intended to present a related concept in a specific manner.

In addition, a value "0" or a value "1" of a field in any embodiment of this application is merely an example, and the values may be interchanged. For example, information indicated by the value "0" of the field may further indicate information indicated by the value "1" of the field, or may be implemented by using another field name or another value. This is not limited herein.

It should be understood that, in this application, "when" and "if" mean that an apparatus performs corresponding processing in an objective situation, and are not intended to limit time. The terms do not mean that the apparatus is required to have a determining action during implementation, and do not mean any other limitation.

In this application, an element represented in a singular form is intended to represent "one or more" or "at least one", and is not intended to represent "one and only one", unless otherwise specified.

It should be understood that in embodiments of this application, "B corresponding to A" indicates that B is associated with A, and B may be determined based on A. However, it should be further understood that determining B based on A does not mean that B is determined based only on A. B may alternatively be determined based on A and/or other information.

For ease of understanding the method provided in embodiments of this application, the following describes a system architecture of the method provided in embodiments of this application. It may be understood that the system architecture described in embodiments of this application is intended to describe the technical solutions in embodiments of this application more clearly, and does not constitute any limitation on the technical solutions provided in embodiments of this application.

The technical solutions provided in this application may be applied to various communication systems, for example, a system using the 802.11 standard. For example, the 802.11 standard includes but is not limited to the 802.11be standard or a next-generation 802.11 standard. A scenario to which the technical solutions of this application are applicable includes communication between an AP and one or more STAs, communication between APs, or communication between STAs. In embodiments of this application, the term "communication" may also be described as "data transmission", "information transmission", or "transmission".

FIG. 1a is a schematic diagram of an architecture of a wireless communication system according to an embodiment of this application.

As shown in FIG. 1a, the wireless communication system may include one or more APs (for example, an AP 101 and an AP 102 in FIG. 1a) and one or more STAs (for example, a STA 201, a STA 202, and a STA 203 in FIG. 1a). Both the AP and the STA support WLAN communication protocols. The communication protocols may include 802.11be (or referred to as Wi-Fi 7, an EHT protocol), and may further include protocols, such as 802.11ax, 802.11ac, and the like. Certainly, with continuous evolution and development of communication technologies, the communication protocols may further include a next-generation protocol of 802.11be, and the like. This is not limited herein. A WLAN is used as an example. An apparatus for implementing a method in this application may be the AP or the STA in the WLAN, or a processor, a chip, or a processing system that is installed in the AP or the STA.

In an embodiment, the access point (for example, the AP 101 or the AP 102 in FIG. 1a) in this application is an apparatus having a wireless communication function, supports communication performed by using a WLAN protocol, and has a function of communicating with another device (for example, a station or another access point) in a WLAN network. Certainly, the access point may further have a function of communicating with another device. In a WLAN system, the access point may be referred to as an access point station (AP STA). The apparatus having the wireless communication function may be an entire device, or may be a chip or a processing system that is installed in the entire device. The device in which the chip or the processing system is installed may implement the method and function in embodiments of this application under control of the chip or the processing system. The AP in embodiments of this application is an apparatus that provides a service for the STA, and may support 802.11 series protocols. For example, the AP may be a communication entity, for example, a communication server, a router, a switch, or a bridge. The AP may include a macro base station, a micro base station, a relay station, and the like in various forms. Certainly, the AP may alternatively be a chip or a processing system in the devices in various forms, to implement the method and function in embodiments of this application.

In an embodiment, the station (for example, the STA 201, the STA 202, or the STA 203 in FIG. 1a) in this application is an apparatus having a wireless communication function, supports communication performed by using the WLAN protocol, and has a capability of communicating with another station or access point in the WLAN network. In the WLAN system, the station may be referred to as a non-access point station (non-AP STA). For example, the STA is any user communication device that allows a user to communicate with the AP and further communicate with the WLAN. The apparatus having the wireless communication function may be an entire device, or may be a chip or a processing system that is installed in the entire device. The device in which the chip or the processing system is installed may implement the method and function in embodiments of this application under control of the chip or the processing system. For example, the STA may be user equipment that can connect to the internet, for example, a tablet computer, a desktop computer, a laptop computer, a notebook computer, an ultra-mobile personal computer (UMPC), a handheld computer, a netbook, a personal digital assistant (PDA), or a mobile phone. Alternatively, the STA may be an internet of things node in the internet of things, a vehicle-mounted communication apparatus in the internet of vehicles, an entertainment device, a game device or system, a global positioning system device, or the like. The STA may alternatively be a chip and a processing system in the foregoing terminals.

The WLAN system may provide high-speed and low-latency transmission. As a WLAN application scenario continuously evolves, the WLAN system is applied to more scenarios or industries, for example, is applied to an internet of things industry, is applied to an internet of vehicles industry or a banking industry, or is applied to enterprise office, a stadium and an exhibition hall, a concert hall, a hotel room, a dormitory, a ward, a classroom, a supermarket, a square, a street, a generation workshop or a warehouse. Certainly, a device (for example, an access point or a station) that supports WLAN communication may be a sensor node (for example, a smart water meter, a smart electricity meter, or a smart air detection node) in a smart city, a smart device (for example, a smart camera, a projector, a display, a television, a stereo, a refrigerator, or a washing machine) in a smart home, a node in the internet of things, an entertainment terminal (for example, augmented reality (AR), virtual reality (VR), or another wearable device), a smart device (for example, a printer, a projector, a loudspeaker, or a stereo) in smart office, an internet of vehicle device in an internet of vehicles, an infrastructure (for example, a vending machine, a self-service navigation station of a supermarket, a self-service cash register device, or a self-service ordering machine) in daily life scenarios, a device in a large sports and music venue, and the like. Specific forms of the STA and the AP are not limited in embodiments of this application, and are merely described as an example herein.

Figure 1B:
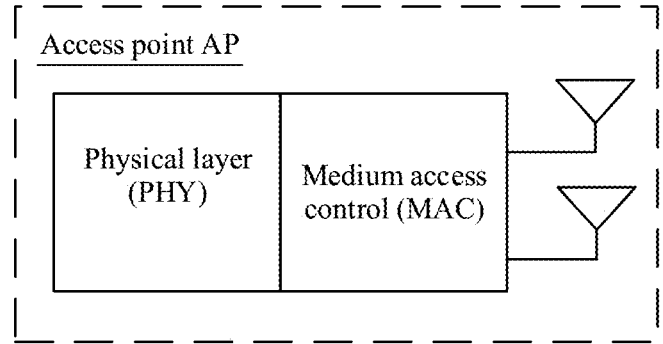
FIG. 1b is a schematic diagram of an AP to which this application is applied.
Figure 1C:
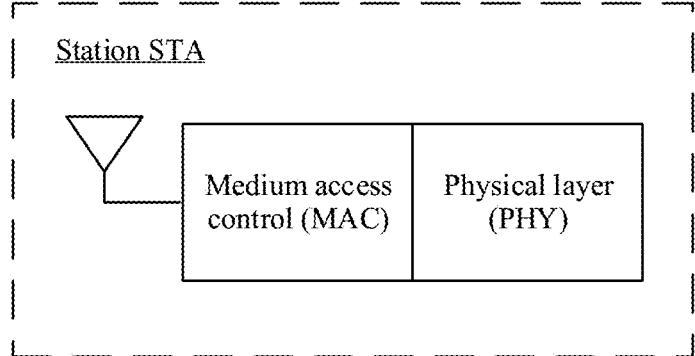
FIG. 1c is a schematic diagram of a STA to which this application is applied.

It should be understood that the 802.11 standard focuses on a physical layer (PHY) part and a media access control (MAC) layer part. For example, FIG. 1*b* is a schematic diagram of a structure of an access point AP according to an embodiment of this application. The AP may have multiple antennas/radio frequencies, or may have a single antenna/radio frequency. The antenna/radio frequency is used to send/receive a data packet (where in this specification, the data packet may also be referred to as a physical layer protocol data unit, that is, a PPDU). In an implementation, an antenna or a radio frequency part of the AP may be separated from a main body of the AP, that is, may be remotely disposed. In FIG. 1*b*, the AP may include a physical layer processing circuit and a media access control processing circuit. The physical layer processing circuit may be configured to process a physical layer signal, and the MAC layer processing circuit may be configured to process a MAC layer signal. For another example, FIG. 1*c* is a schematic diagram of a structure of a station STA according to an embodiment of this application. FIG. 1*c* is a schematic diagram of a structure of a STA that has a single antenna/radio frequency. In an actual scenario, the STA may alternatively have multiple antennas/radio frequencies, and may be a device with more than two antennas. The antenna/radio frequency is used to send/receive a data packet. In an implementation, an antenna or a radio frequency part of the STA may be separated from a main body of the STA, that is, may be remotely disposed. In FIG. 1*c*, the STA may include a PHY processing circuit and a MAC processing circuit. The physical layer processing circuit may be configured to process a physical layer signal, and the MAC layer processing circuit may be configured to process a MAC layer signal.

The foregoing content briefly describes the system architecture in embodiments of this application. To better understand the technical solutions in embodiments of this application, the following describes content related to embodiments of this application.

1. An AP Allocates Uplink Resource to a STA.

WLAN has gone through a plurality of generations, including 802.11a/b/g, 802.11n, 802.11ac, 802.11ax, and 802.11be that is under discussion. The 802.11n standard may be referred to as a high throughput (HT), the 802.11ac standard may be referred to as a very high throughput (VHT), 802.11ax (Wi-Fi 6) may be referred to as a high efficiency (HE), 802.11be (Wi-Fi 7) may be referred to as an extremely high throughput (EHT), and previous standards of the HT, such as 802.11a/b/g, may be collectively referred to as non-high throughput (Non-HT) standards.

For uplink data transmission, the STA may perform uplink data transmission after obtaining a transmission right through channel contention, for example, based on enhanced distributed channel access (EDCA). In 802.11ax, a trigger frame-based uplink transmission method is further introduced, and a procedure of the trigger frame-based uplink transmission method includes the following operations.

Operation 1: The AP first sends a trigger frame (for example, a trigger frame in FIG. 2*a*), and the trigger frame includes related information required by one or more stations (STAs) to send a trigger-based PPDU (TB PPDU), for example, resource unit allocation and other information.

As shown in FIG. 2*a*, the entire trigger frame includes a common information ("Common Info") field and a user information list ("User Info List") field. The common information field includes common information that needs to be read by all STAs, the user information list field includes one or more user information fields, and each user information field includes information that needs to be read by each STA. In the user information field, an association identifier (Association Identification 12 (AID12)) represents an association identifier of a specific STA, and a resource unit allocation ("RU Allocation") subfield indicates a location of a specific RU that is allocated to a STA (e.g., the STA indicated by the AID12). Specific content of the common information field and the user information field is shown in FIG. 2*b*.

Operation 2: After receiving the trigger frame, the STA obtains, by parsing the trigger frame, user information field that matches an AID of the STA, and then sends a high efficiency trigger-based PPDU (HE TB PPDU) (which is one of four types of HE PPDUs) on an RU indicated by the resource unit allocation subfield in the user information field.

For example, fields included in the HE TB PPDU are shown in FIG. 2*c*, and names and functions of the fields are as follows:

TABLE 1

| English acronym/ abbreviation | Full English expression | Chinese expression | Function |
|---|---|---|---|
| | Meanings of fields in an HE TB PPDU | | |
| L-STF | Legacy Short Training Field | Legacy short training sequence | Performs PPDU discovery, coarse synchronization, and automatic gain control |
| L-LTF | Legacy Long Training Field | Legacy long training sequence | Performs fine synchronization and channel estimation |
| L-SIG | Legacy Signal Field A | Legacy signal field | Carries signaling information related to a PPDU length, to ensure coexistence |
| HE-SIG-A | High Efficient Signal Field A | High efficiency signal field A | Carries signaling used to demodulate subsequent data |
| HE-STF | High Efficient Short Training | High efficiency | Performs automatic gain control of a subsequent |

TABLE 1-continued

| | | | |
|---|---|---|---|
| Meanings of fields in an HE TB PPDU | | | |
| English acronym/ abbreviation | Full English expression | Chinese expression | Function |
| | Field | short training sequence | field |
| HE-LTF | High Efficient Long Training Field | High efficiency long training sequence | Estimates a channel |
| Data | | Data | Carries data information |

In Table 1, when a bandwidth is not greater than 20 MHz, transmission of first four items from L-STF to HE-SIG-A is performed in a unit of 20 megahertz (MHz); or when the bandwidth is greater than 20 MHz, duplicate transmission of the first four items L-STF to HE-SIG-A is performed in the unit of 20 MHz.

In addition, as for last three items from HE-STF to the Data in Table 1, the entire bandwidth may be divided into one or more resource units. It should be noted that in the 802.11ax standard, only one RU can be allocated to one STA. The next-generation 802.11be standard allows multiple RUs (multi-RU or MRU) to be allocated to one STA.

Operation 3: After receiving an uplink multi-user PPDU formed by uplink sub-PPDUs sent by the one or more stations, the AP may further reply with an acknowledgment frame.

Figures 1, 2D:
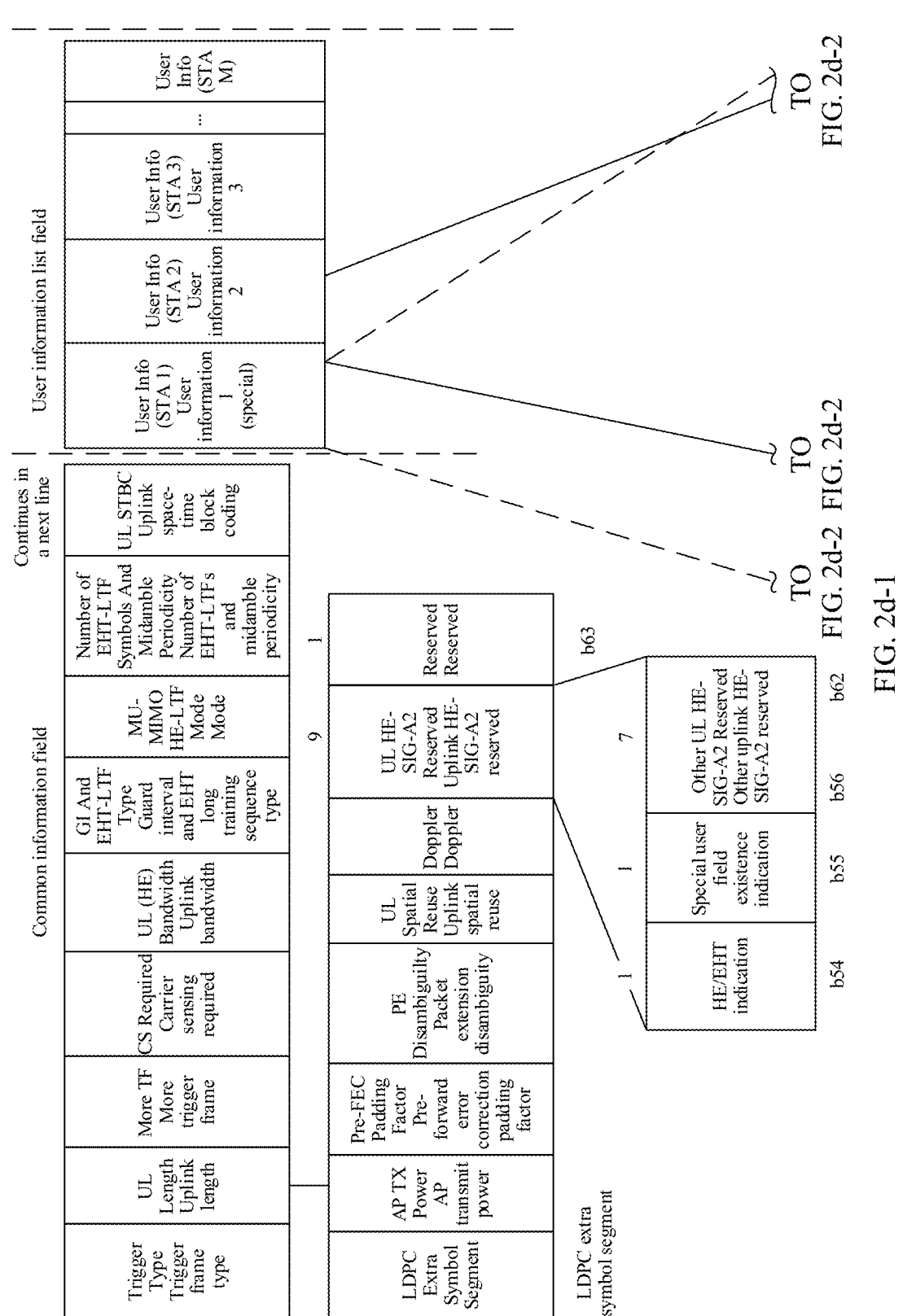
FIG. 2d-1 and FIG. 2d-2 are another schematic diagram of a trigger frame according to this application.
Figures 2, 2D:
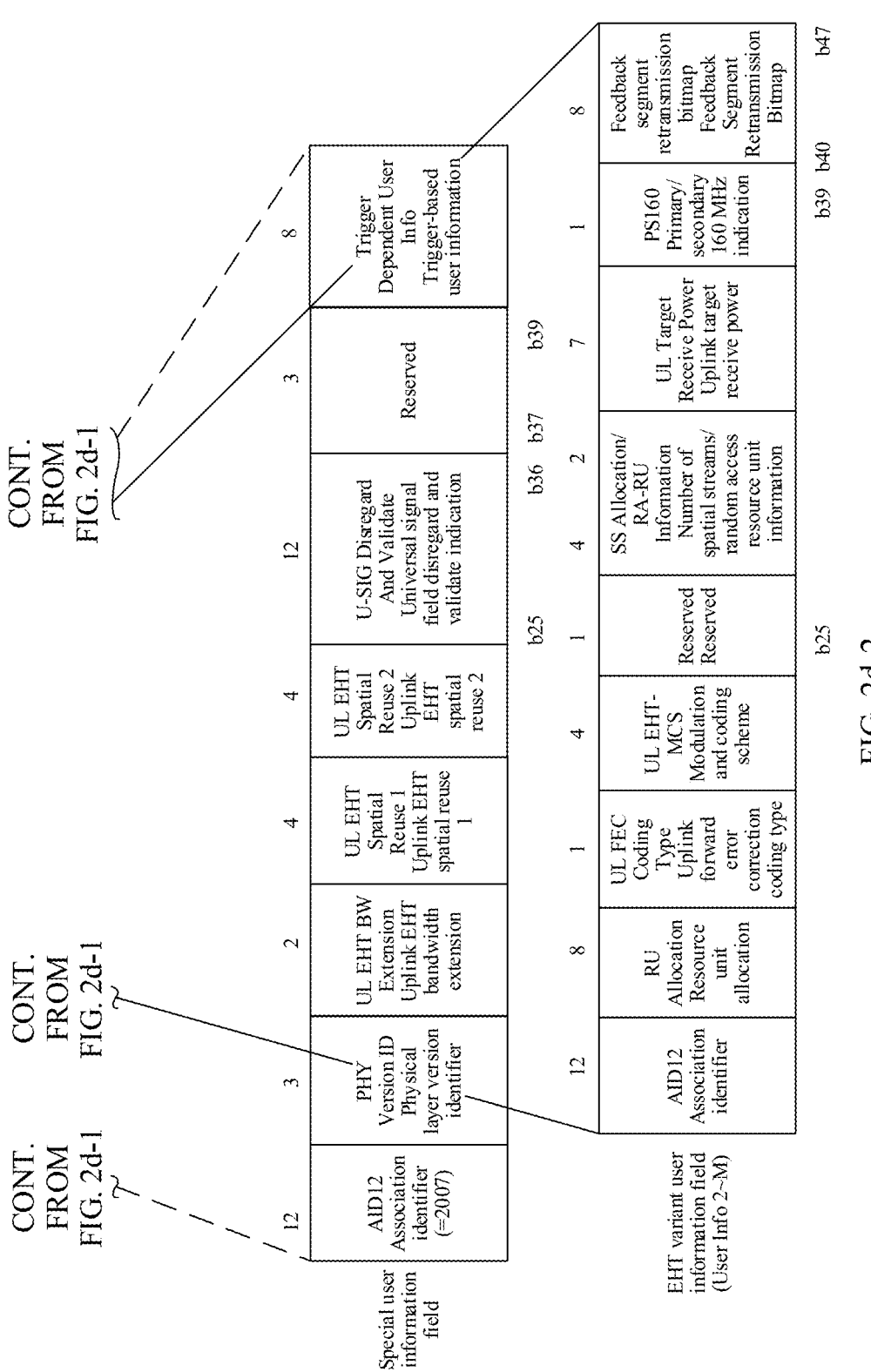

In 802.11be, a procedure in which the trigger frame triggers the TB PPDU also exists. The procedure is similar to that in 11ax, except that some other signaling indications, such as resource unit allocation in 320 MHz, are added or extended. A person skilled in the art can understand the added or extended content, which is not described herein. A structure of the trigger frame of the 11be is shown in FIG. 2*d*-1 and FIG. 2*d*-2.

Currently, in a trigger-based transmission procedure, a concept of an adaptive RU is proposed. For example, a triggered station may adaptively adjust, based on a detected channel busy/idle state, a size of an RU or MRU allocated by a trigger frame, and select an RU or MRU less than that allocated by the trigger frame for sending, to avoid using a channel that is detected to be busy. Details are described below.

2. Adaptive RU in Uplink Resource

In the foregoing trigger frame-based uplink scheduling transmission method, because the trigger frame sent by the AP includes a carrier sensing required field that indicates that the station needs to perform carrier sensing, when performing TB PPDU transmission, the STA performs carrier sensing on one or more 20 MHz sub-channels corresponding to an MRU/RU that is allocated to the STA, to detect whether sensed energy exceeds a predetermined threshold. If the energy sensed by the STA on a specific 20 MHz sub-channel exceeds the predetermined threshold, it indicates that the 20 MHz sub-channel is busy; or if the energy sensed by the STA on a specific 20 MHz sub-channel does not exceed the predetermined threshold, it indicates that the 20 MHz sub-channel is idle. It is stipulated in the 802.11ax standard that if at least one 20 MHz sub-channel in a frequency range corresponding to an RU that is allocated to the STA is busy, HE TB PPDU may not be transmitted, to avoid interference to other transmission.

Figures 3A, 3B:
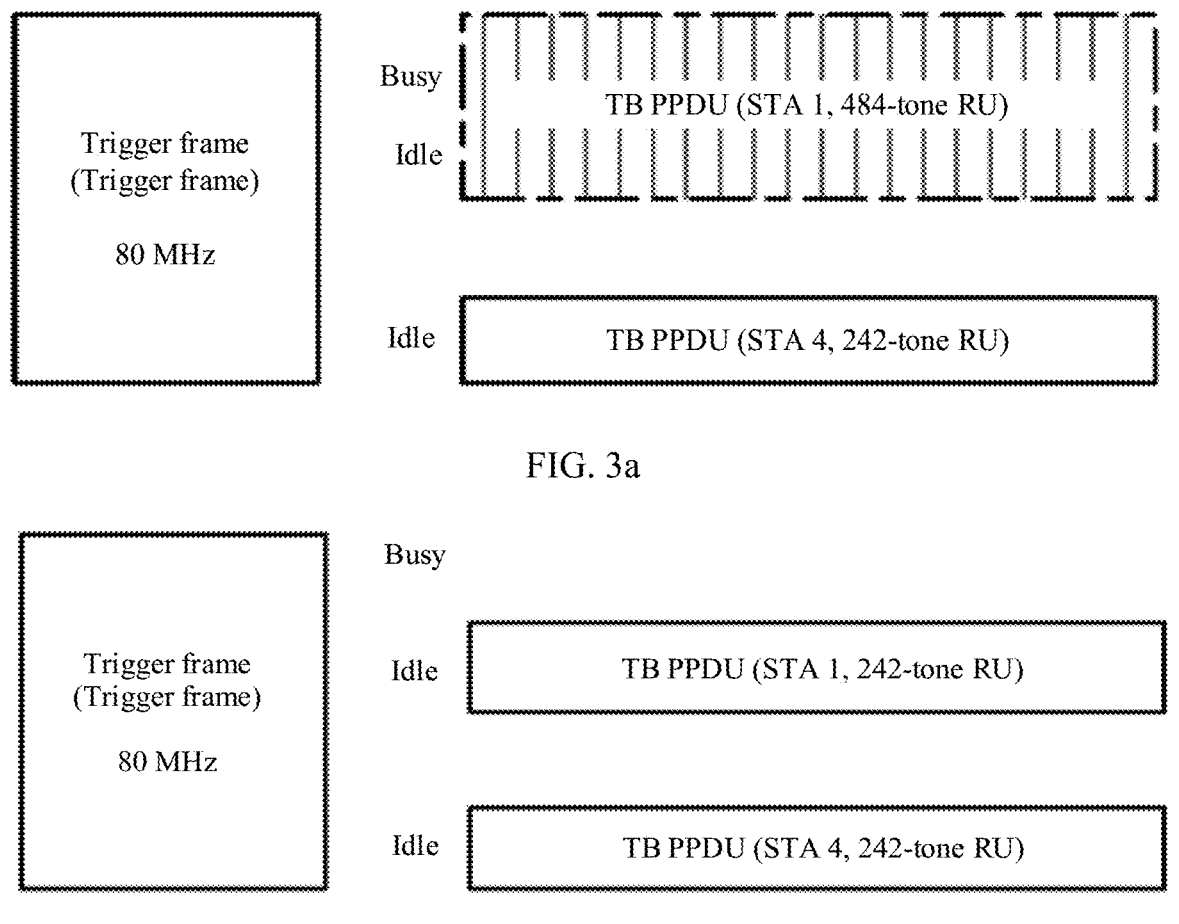
FIG. 3a is a schematic diagram of configuring an RU based on a trigger frame according to this application.
FIG. 3b is another schematic diagram of configuring an RU based on a trigger frame according to this application.

The following provides descriptions by using an implementation example shown in FIG. 3*a*.

For example, FIG. 3*a* is a schematic diagram of HE TB PPDU transmission on which carrier sensing is performed. For a STA 1, an RU that is allocated to the STA 1 is a 484-tone RU (where "tone" means a subcarrier), and a frequency range corresponding to the 484-tone RU is 40 MHz and includes two 20 MHz sub-channels. The STA 1 performs carrier sensing before transmission. If it is found that one of the 20 MHz sub-channels is busy and the other 20 MHz sub-channel is idle, the STA 1 may not perform transmission on the allocated 484-tone RU. For a STA 4, an RU that is allocated to the STA 4 is a 242-tone RU, and a frequency range corresponding to the 242-tone RU is 20 MHz and includes one 20 MHz sub-channel. The STA 4 performs carrier sensing before transmission. If it is found that the 20 MHz sub-channel is idle, the STA 4 may transmit an HE TB PPDU on the allocated 242-tone RU. It should be understood that the 484-tone RU represents a resource unit that includes 484 tones. Similarly, the 242-tone RU represents a resource unit that includes 242 tones. Z-tone-RU in the following represents a similar meaning, that is, represents a resource unit that includes Z (Z is a positive integer) tones. Details are not described in the following.

In the trigger frame-based uplink scheduling transmission method in 802.11be, a concept of the adaptive RU is proposed. For example, a triggered station may adaptively select, based on a channel busy/idle state that is detected through sensing, a part of an RU or MRU (that is, an adaptive RU) allocated by a trigger frame to the station, to transmit a TB PPDU, to avoid using a detected busy channel.

The following provides descriptions by using an implementation example shown in FIG. 3*b*.

For example, FIG. 3*b* is a schematic diagram of transmitting a TB PPDU by using an adaptive RU. For a STA 1, an RU that is allocated to the STA 1 is a 484-tone RU, and a frequency range corresponding to the 484-tone RU is 40 MHz and includes two 20 MHz sub-channels. The STA 1 performs carrier sensing before transmission. If it is found that one of the 20 MHz sub-channels is busy and the other 20 MHz sub-channel is idle, the STA 1 may transmit a TB PPDU on the idle 20 MHz sub-channel (or a 242-tone RU). The idle 242-tone RU may be referred to as an adaptive RU. For a STA 4, an RU that is allocated to the STA 4 is a 242-tone RU, and a frequency range corresponding to the 242-tone RU is 20 MHz and includes one 20 MHz sub-channel. The STA 4 performs carrier sensing before transmission. If it is found that the 20 MHz sub-channel is idle, the STA 4 may transmit a TB PPDU on the allocated 242-tone RU.

When a busy sub-channel exists in the MRU/RU that is allocated to the STA (where in this specification, a "busy sub-channel" means that a state of a sub-channel is busy), the STA may still perform transmission if the following two conditions are met:

(1) The allocated MRU/RU includes at least one idle sub-channel (where in this specification, an "idle sub-channel" means that a state of a sub-channel is idle).

(2) An available resource unit that meets a stipulation exists in a resource unit corresponding to the at least one idle sub-channel (where sending is not supported for all resource unit styles).

In the condition (2), the resource unit style may indicate a tone style of the RU, for example, a 26-tone RU, 52-tone RU, 106-tone RU, 242-tone RU, 484-tone RU, 996-tone RU, and 2*996-tone RU may be considered as RUs of different resource unit styles. In addition, the available resource unit that meets the specification (that is, an adaptive RU) may be an MRU/RU format currently supported by 802.11be. For details, refer to current descriptions of the 802.11be standard. Because this application does not relate to a specific adaptive RU format, details are not described herein.

It should be understood that, for ease of description, in this application, an adaptive RU represents a resource unit whose size changes (that is, a resource unit that is actually transmitted by a station is different from an MRU/RU that is allocated to the station in size). The term also covers an adaptive MRU. Differentiation is not described in the following.

It can be learned that an adaptive RU is proposed for an MRU/RU in 802.11be, that is, a station performs transmission on some allocated idle sub-channels, so that a spectrum resource can be used more efficiently.

3. LDPC in HT

Currently, a data field in 802.11 supports a binary convolutional code (BCC) encoding manner and an LDPC encoding manner. The following mainly describes an LDPC encoding process in the HT (using 802.11n as an example). In the HT, the LDPC encoding process is mainly divided into five operations, including the following operations.

Operation A: Calculate a number of available bits.

The number of available bits of a to-be-sent data field in the STA may be obtained by using the following formula:

$$N_{pld} = length \times 8 + 16; \qquad (1)$$

$$N_{avbits} = N_{CBPS} \times m_{STBC} \times \left\lceil \frac{N_{pld}}{N_{CBPS} \times R \times m_{STBC}} \right\rceil; \qquad (2)$$

In Formula (1) and Formula (2), $N_{pld}$ indicates a number of uncoded bits in a physical layer service data unit (PSDU) and a service field, pld in $N_{pld}$ represents a payload "payload", and a relationship between the pld and a length value (length) is as described in the foregoing formula. length is a value of an HT Length field in an HE-SIG field.

In Formula (2), $N_{avbits}$ is an initial total number of available coded bits (avbits represents available bits. For a reason why the number is initial, refer to the following descriptions related to updating in operation D). The meaning of $m_{STBC}$ is as follows: When space-time block coding (STBC) is used, $m_{STBC}$ is 2; or when STBC is not used, $m_{STBC}$ is 1. R is a code rate, and represents a percentage of information bits in a total number of coded bits.

In Formula (2), $\lceil \ \rceil$ represents rounding up, a total number of symbols is calculated based on a rounded up part and $m_{STBC}$, and $N_{avbits}$ is obtained based on a number of coded bits per symbol (number of coded bits per symbol, $N_{CBPS}$). $N_{CBPS} \times R$ represents a number of bits of the information bits.

Operation B: Obtain a number of codewords $N_{CW}$ and a codeword length $L_{LDPC}$ based on $N_{avbits}$ in operation A.

For $N_{avbits}$ obtained in operation A, a PPDU encoding parameter table shown as Table 2 is searched, and a number of codewords $N_{CW}$ and a codeword length $L_{LDPC}$ corresponding to $N_{avbits}$ may be obtained.

TABLE 2

| Range of Navbits (bits) | Number of LDPC codewords ($N_{CW}$) | LDPC codeword length $L_{LDPC}$ (bits) |
|---|---|---|
| $N_{avbits} \pounds 648$ | 1 | 1296, if $N_{avbits} \ddagger N_{pld} + 912 \times$ (1 − R) 648, otherwise |

TABLE 2-continued

| Range of Navbits (bits) | Number of LDPC codewords ($N_{CW}$) | LDPC codeword length $L_{LDPC}$ (bits) |
|---|---|---|
| $648 < N_{avbits} \pounds 1296$ | 1 | 1944, if $N_{avbits} \ddagger N_{pld} + 1464 \times$ (1 − R) 1296, otherwise |
| $1296 < N_{avbits} \pounds 1944$ | 1 | 1944 |
| $1944 < N_{avbits} \pounds 2592$ | 2 | 1944, if $N_{avbits} \ddagger N_{pld} + 2916 \times$ (1 − R) 1296, otherwise |

| Range of Navbits (bits) | Number of LDPC codewords ($N_{cw}$) | LDPC codeword length $L_{LDPC}$ (bits) |
|---|---|---|
| $2592 < $ Navbits | $\left\lceil \dfrac{N_{pld}}{1944\,R} \right\rceil$ | 1944 |

In the foregoing Table 2, a first column of data represents a value range of Navbits (Range of Navbits), and a unit is bits. A second column of data represents a number of LDPC codewords, and is denoted as $N_{CW}$. A third column of data represents an LDPC codeword length $L_{LDPC}$, and is denoted as $L_{LDPC}$.

Operation C: Calculate a number of shortened bits based on operation A and operation B.

After the number of codewords $N_{CW}$ and the codeword length $L_{LDPC}$ corresponding to $N_{avbits}$ are obtained in operation B, the number of shortened bits needs to be calculated. This part of bits is generated because the information bits may not carry so many bits (bits carried in the information bits can only be $N_{pld}$). Therefore, this part of bits are considered as information bits, but are not actual information bits, and are set to 0 in an encoding process, are not transmitted in an actual process, and are also referred to as shortened bits. For a meaning of the shortened bits, refer to the following formula:

$$N_{shrt} = max(0, (N_{CW} \times L_{LDPC} \times R) - N_{pld}); \qquad (3)$$

In Formula (3), $N_{shrt}$ represents shortened bits, $N_{CW} \times L_{LDPC} \times R$ represents a total number of bits of the information bits (or referred to as a number of uncoded bits, or referred to as a number of bits other than parity bits), $N_{pld}$ represents a total number of uncoded bits that may be supported, and max(A, B) represents a maximum value in A and B.

Operation D: Calculate a number of punctured bits.

In an LDPC encoding process of a data field of the HT, excess parity bits need to be punctured (punctured), as shown in the following formula:

$$N_{punc} = max(0, (N_{CW} \times L_{LDPC}) - N_{avbits} - N_{shrt}); \qquad (4)$$

A meaning represented by Formula (4) is: a number of bits that need to be punctured=a total number of coded bits−a total number of available bits−a number of shortened bits, or a number of bits that need to be punctured=0, and max(A, B) represents a maximum value in A and B.

(a total number of coded bits−a total number of available bits−a number of shortened bits) may also be understood as (a total number of coded bits−a number of shortened bits−a total number of available bits), which represents a number of excess parity bits, that is, a number of parity bits that need to be deleted.

It should be noted that a case in which a number of bits that need to be deleted is too large exists. In such a case, LDPC decoding performance is affected. Therefore, the following manner is used in the HT to update related parameters when a number of deleted bits is too large. The manner is described below.

An updating process in operation D is as follows.

Whether a number of punctured bits is too large may be determined based on the following two conditions:

$$((N_{punc} > 0.1 \times N_{CW} \times L_{LDPC} \times (1 - R)) \text{ AND } (N_{shrt} < 1.2 \times N_{punc} \times \frac{R}{1 - R}));$$

$$(N_{punc} > 0.3 \times N_{CW} \times L_{LDPC} \times (1 - R));$$

The foregoing first condition indicates a case in which a number of bits of deleted parity bits exceeds 10% of a total number of bits of the parity bits, and the number of the deleted parity bits exceeds a number of the shortened bits by a specific proportion.

The foregoing second condition indicates a case in which the number of bits of the deleted parity bits exceeds 30% of the total number of bits of the parity bits.

In an embodiment, implementation of the condition 1 and the condition 2 in operation D is merely an example. A parameter "0.1" may also be replaced with another value (for example, 0.11 or 0.15), and a parameter "30%" may also be replaced with another value (for example, 0.35 or 0.4). The condition is mainly used to determine whether the LDPC decoding performance is affected by a large number of deleted parity bit data.

If any one of the foregoing conditions is met, it indicates that the number of deleted bits is too large, and the following updating needs to be performed:

$$N_{avbits} = N_{avbits} + N_{CBPS} \times m_{STBC}; \quad (5)$$

$$N_{punc} = \max(0, (N_{CW} \times L_{LDPC}) - N_{avbits} - N_{shrt}); \quad (6)$$

Formula (5) and Formula (6) indicate that more symbols are used to carry parity bits that are originally deleted. In this case, it is equivalent to that the number of deleted bits is reduced by $N_{CBPS} \times m_{STBC}$. After processing in the updating process, updating of the initial total number of available coded bits $N_{avbits}$ in operation A is implemented. In addition, fewer bits are deleted or need to be punctured. This improves LDPC performance.

Operation E: Calculate a number of repeat bits.

The updating process in operation D is a case (based on the condition 1 or the condition 2) in which a part of the parity bits needs to be deleted because the total number of available bits is insufficient to support the parity bits in operation D. However, with different selections of the number of codewords $N_{CW}$ and the codeword length $L_{LDPC}$, a case in which the total number of bits may be greater than a number of the parity bits and a number of shortened information bits may occur. In this case, a repeat operation needs to be performed, as shown in Formula (7), to supplement the total number of available bits. This improves performance.

$$N_{rep} = \max(0, N_{avbits} - N_{CW} \times L_{LDPC} \times (1 - R) - N_{pld}); \quad (7)$$

In Formula (7), $N_{rep}$ represents a number of bits that are repeatedly sent.

It should be noted that when a parity bit is deleted ($N_{punc} > 0$), repeat in operation E does not exist. When repeat exists, no parity bit is deleted.

To describe the foregoing process more clearly, the 802.11 standard further provides the following LDPC encoding process diagram of the data field in the HT, as shown in FIG.

Condition 1

Condition 2

Figure 4:
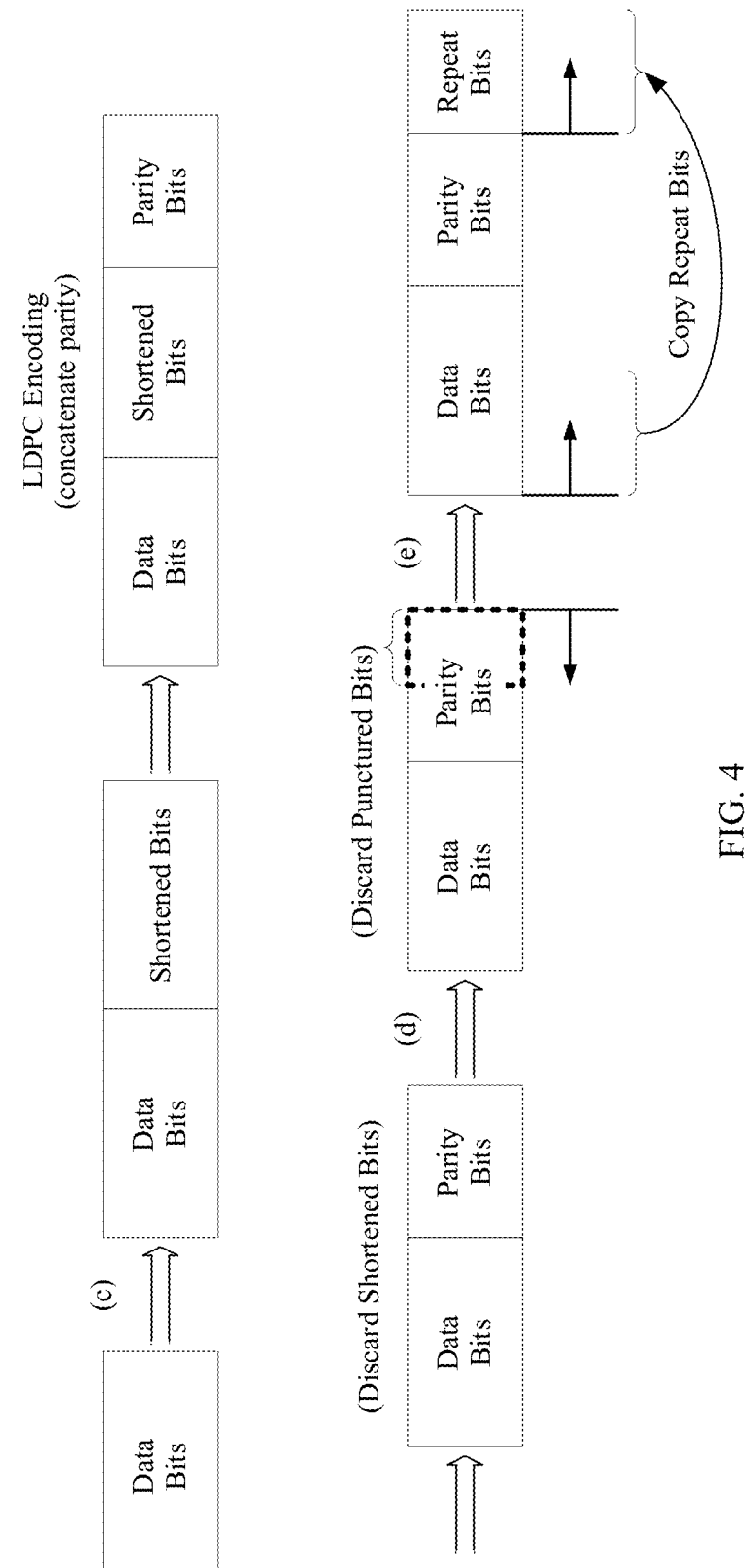
FIG. 4 is a schematic diagram of an LDPC encoding process according to this application.

4. In FIG. 4, a process indicated by an arrow (c) is an implementation process of calculating data bits, calculating shortened bits, and calculating parity bits in a concatenate parity manner in LDPC encoding in the foregoing operation A, operation B, and operation C. A code block obtained by discarding shortened bits is located before an arrow (d). Then, the code block is determined based on the condition 1 and the condition 2 in the foregoing operation D. If the updating process in operation D is performed, a code block obtained by discarding parity bits is obtained, as shown behind the arrow (d) in FIG. 4. If the repeat process in operation E is performed, a code block obtained by copying repeat bits is obtained, as shown behind an arrow (e) in FIG. 4.

4. LDPC in EHT

Figure 5:
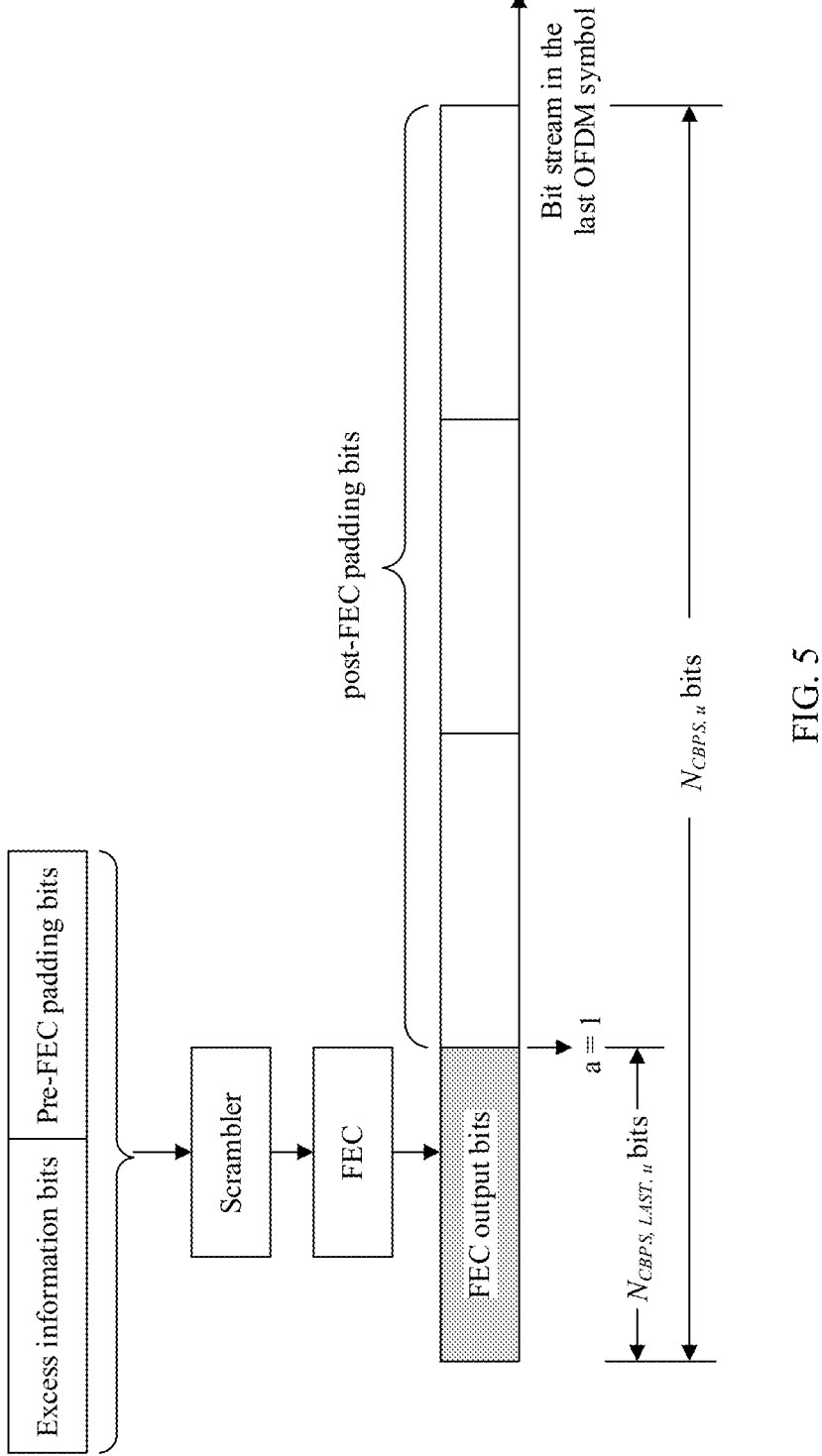
FIG. 5 is a schematic diagram of an LDPC symbol segment according to this application.

A biggest difference between LDPC encoding in the EHT and LDPC encoding in the HT lies in that a padding segment is added to a tail of the PPDU. As shown in FIG. 5, a last symbol that participates in encoding is shown. Not all tones of the symbol participate in encoding, but only some segments are coded. In this way, decoding may only be performed on some segments during decoding. This reduces overheads. In addition, a packet extension (PE) field that follows the symbol may exist. This provides more processing time to a receiver.

Specifically, in FIG. 5, scrambling (or Scrambler) and forward error correction (FEC) are performed on excess information bits and pre-forward error correction bits (Pre-FEC padding bits), to obtain forward error correction output bits (FEC output bits), which are denoted as $N_{CBPS,LAST,u}$.

Meanings of related parameters in FIG. 5 are as follows:

Excess information bits represent the excess information bits;

Pre-FEC padding bits represent the uncoded padding bits, and participate in encoding;

FEC output bits represent coded bits that are output;

Scrambler and FEC respectively represent scrambling by using scrambling code and encoding by using FEC;

Post-FEC padding bits represent a number of bits that need to be padded for a number of coded bits to reach the total number of bits, and does not participate in encoding;

$N_{CBPS,Last,u}$ represents a number of coded bits of the last symbol that participates in encoding; and $N_{CBPS,u}$ represents a total number of bits of the last symbol that participates in encoding.

In addition, in FIG. 5, a represents an intercept location of encoding. There are four intercept locations in total, that is, a=1, a=2, a=3, and a=4, respectively representing that the FEC output bits occupy about 1/4, 2/4, 3/4, and 1 of the entire symbol. In other words, when a=4, all tones participate in encoding.

Due to the foregoing difference, in operation A of LDPC encoding of the data field of multi-user PPDU (multiple user physical layer protocol data unit, MU PPDU) in the EHT, the calculation formula (1) and calculation formula (2) are changed to the following calculation formula (8) and calculation formula (9):

$$N_{pld,u} = (N_{SYM,init} - 1)N_{DBPS,u} + N_{DBPS,last,init,u}; \quad (8)$$

$$N_{avbits,u} = (N_{SYS,init} - 1)N_{CBPS,u} + N_{CBPS,last,init,u}; \quad (9)$$

$N_{SYM,init}$ represents an initial number of symbols (which may also be updated in operation d, so the number is initial herein), and $N_{DBPS,last,init,u}$ represents the uncoded data bits (related to a). a and $N_{SYM,init}$ may be calculated based on Formula (10) and Formula (11).

$$a_{init,u} = \begin{cases} 4, & \text{if } N_{Excess,u=0} \\ \min\left(\left\lceil \dfrac{N_{Excess,u}}{N_{DBPS,short,u}} \right\rceil, 4\right), & \text{otherwise} \end{cases}; \quad (10)$$

$$N_{SYM,init,u} = \left\lceil \frac{8 \cdot APEP_{LENGTH_u} + N_{tail} + N_{service}}{N_{DBPS}} \right\rceil; \quad (11)$$

$N_{Excess,u}$ meets Formula (12):

$$N_{Excess,u} = \text{mod}\big(8 \cdot APEP_{LENGTH_u} + N_{tail} + N_{service}, N_{DBPS,u}\big); \quad (12)$$

In Formula (11) and Formula (12), $APEP_{LENGTH_u}$ represents TXVECTOR parameter APEP_LENGTH of a user u, and $N_{tail}$ represents tail bits of an encoder.

The processes B and C of the EHT are similar to that of the HT, and a corresponding number of codewords $N_{CW}$ and codeword length $L_{LDPC}$ may be obtained based on $N_{avbits,u}$. If any user meets the determination (that is, excess puncturing is performed) in operation D, the number of available bits also needs to be increased to place some bits that should be deleted. This improves LDPC encoding performance. Correspondingly, the foregoing determination formula condition 1 and condition 2 change to the following condition 3 and condition 4:

Condition 3:

$$((N_{punc,u} > 0.1 \times N_{CW,u} \times L_{LDPC,u} \times (1 - R_u)) \text{ AND } (N_{shrt,u} < 1.2 \times N_{punc,u} \times \frac{R_u}{1 - R_u}));$$

$$(N_{punc,u} > 0.3 \times N_{CW,u} \times L_{LDPC,u} \times (1 - R_u)); \qquad \text{Condition 4}$$

It should be noted that implementation of the condition 3 and the condition 4 is merely an example. A parameter "0.1" may also be replaced with another value (for example, 0.11 or 0.15), and a parameter "30%" may also be replaced with another value (for example, 0.35 or 0.4). The condition is mainly used to determine whether the LDPC decoding performance is affected by a large number of deleted parity bit data.

If any of the preceding conditions is met, updating is required. An update manner is as follows:

$$\begin{cases} N_{SYM} = N_{SYM,init} + 1 \text{ and } a = 1, & \text{if } a_{init} = 4 \\ N_{SYM} = N_{SYM,init} \text{ and } a = a_{init} + 1, & \text{otherwise} \end{cases}; \quad (13)$$

It should be noted from Formula (13) that the update manner in the EHT is no longer the same as that in the HT. In the EHT, a granularity of a tone is no longer increased based on a granularity of a symbol, but is increased based on a granularity of a symbol segment. This is because a number of tones supported by each symbol in the EHT is about five times that in the HT. Therefore, the granularity of tones is increased based on the granularity of the symbol segment, and does not need to be increased based on the granularity of the symbol. It can be learned from the foregoing formula that, when $a_{init}=4$, one symbol needs to be added, and in this case, updated a is equal to 1. When $a_{init}<4$, no symbol needs to be added, and only a segment needs to be added.

If the value does not need to be updated, the value of $N_{SYM}$ and a is the value of $N_{SYM,init}$ and $a_{init}$.

Whether the update is performed may be notified through an LDPC Extra Symbol Segment subfield in an EHT-SIG of the MU PPDU. For example, when a value of the LDPC Extra Symbol Segment subfield is 1, it indicates that an LDPC extra symbol segment exists, that is, updating is performed. When the value of the LDPC Extra Symbol Segment subfield is 0, it indicates that an LDPC extra symbol segment does not exist, that is, the updating is not performed.

The foregoing mainly describes, by using Formula (8) to Formula (13), a difference between LDPC encoding of the MU PPDU in the EHT and LDPC encoding of the PPDU in the HT. In addition to the difference, in the HT, the STA independently determines whether to perform transmission based on the extra symbol segment, but in the EHT, the AP indicates to the STA whether to perform transmission based on the extra symbol segment.

A process in which LDPC encoding is performed on the TB PPDU in the EHT may also be implemented by using an LDPC encoding manner that is similar to the foregoing LDPC encoding manner for the MU PPDU in the EHT. For example, in a process in which LDPC encoding is performed on the TB PPDU in the EHT, the AP may indicate $N_{SYM}$ and a to the STA by using the trigger frame. a is directly provided, and $N_{SYM}$ is obtained through comprehensive calculation by using a plurality of fields in the trigger frame.

It should be noted that $N_{SYM}$ and a provided herein are not initial $N_{SYM,init}$ and $a_{init}$, but updated $N_{SYM}$ and a. Then, in a transmission process of the TB PPDU, whether the extra symbol segment is required does not need to be determined by the STA that sends the TB PPDU, but is determined by the AP that sends the trigger frame, and is provided by the LDPC Extra Symbol Segment subfield in the common information field in the trigger frame.

If the value of the LDPC Extra Symbol Segment subfield is 1, an updating process as shown in the following Formula (14) is definitely performed:

$$\begin{cases} a_{init} = 4 \text{ and } N_{SYM,init} = N_{SYM} - 1, & \text{if } a = 1 \\ a_{init} = a - 1 \text{ and } N_{SYM,init} = N_{SYM}, & \text{otherwise} \end{cases} \quad (14)$$

In Formula (14), 1 is subtracted from a value of $N_{SYM}$ or 1 is subtracted from a value of a. In addition, in operation D described in the HT, 1 is added back by using the update manner of Formula (5) and Formula (6), or is added back by using an update manner of Formula (13) described in EHT, that is, one extra symbol segment is always added, to avoid a case in which excess puncturing is performed.

If the value of the LDPC Extra Symbol Segment subfield is 0, $N_{SYM}$ and a are initial values and do not need to be updated in the process D.

Another encoding manner is similar to those described in the HT. Details are not described herein again.

In the foregoing implementation process of the EHT, in a process of transmitting the TB PPDU, the STA determines whether an extra symbol segment for LDPC encoding exists based on the value of the LDPC Extra Symbol Segment subfield in the trigger frame sent by the AP. When the value of the LDPC Extra Symbol Segment subfield is 0, the extra symbol segment does not exist. When the value of the LDPC Extra Symbol Segment subfield is 1, an extra symbol segment exists.

However, the value of the LDPC Extra Symbol Segment subfield in the trigger frame is determined, based on a resource allocated by the AP, by the AP that sends the trigger frame. When a TB PPDU transmitted based on the adaptive RU exists, setting the LDPC Extra Symbol Segment subfield by the AP may not be applicable to the changed TB PPDU transmitted based on the adaptive RU. When the value of the LDPC Extra Symbol Segment subfield is 1 but a value that is of the LDPC Extra Symbol Segment subfield and that is applicable to the TB PPDU is 0 (that is, the STA does not require an extra symbol segment), efficiency is partly affected. However, a larger problem is that when the value of the LDPC Extra Symbol Segment subfield is 0 but the value that is of the LDPC Extra Symbol Segment subfield and that is applicable to the TB PPDU is 1 (that is, the STA requires an extra symbol segment), because related bits are not carried based on the extra symbol segment, decoding performance of a receiving end of the TB PPDU is affected.

In conclusion, when the STA performs transmission based on the adaptive RU, because a number of bits carried in the PPDU transmitted based on the adaptive RU is different from a number of bits carried in a PPDU transmitted based on a complete RU or MRU, the implementation, of the STA, based on the specification does not adapt to transmission performed by the STA on the adaptive RU. This reduces communication efficiency.

To resolve the foregoing problem, this application provides a communication method and a communication apparatus, to improve WLAN communication efficiency. The following describes in detail the communication method and the communication apparatus provided in this application with reference to the accompanying drawings. It should be noted that, for ease of understanding, different operations described in the following embodiments may be combined into a same operation. In addition, a time sequence between different operations may be randomly configured unless a time sequence is necessarily limited. For example, operation S101 and operation S102 may be performed by using one operation, or may be separately performed as two operations. In addition, when operation S101 and operation S102 are separately performed as two operations, operation S101 is performed before operation S102, or operation S102 is performed before operation S101. This is not limited herein.

Figures 6, 7:
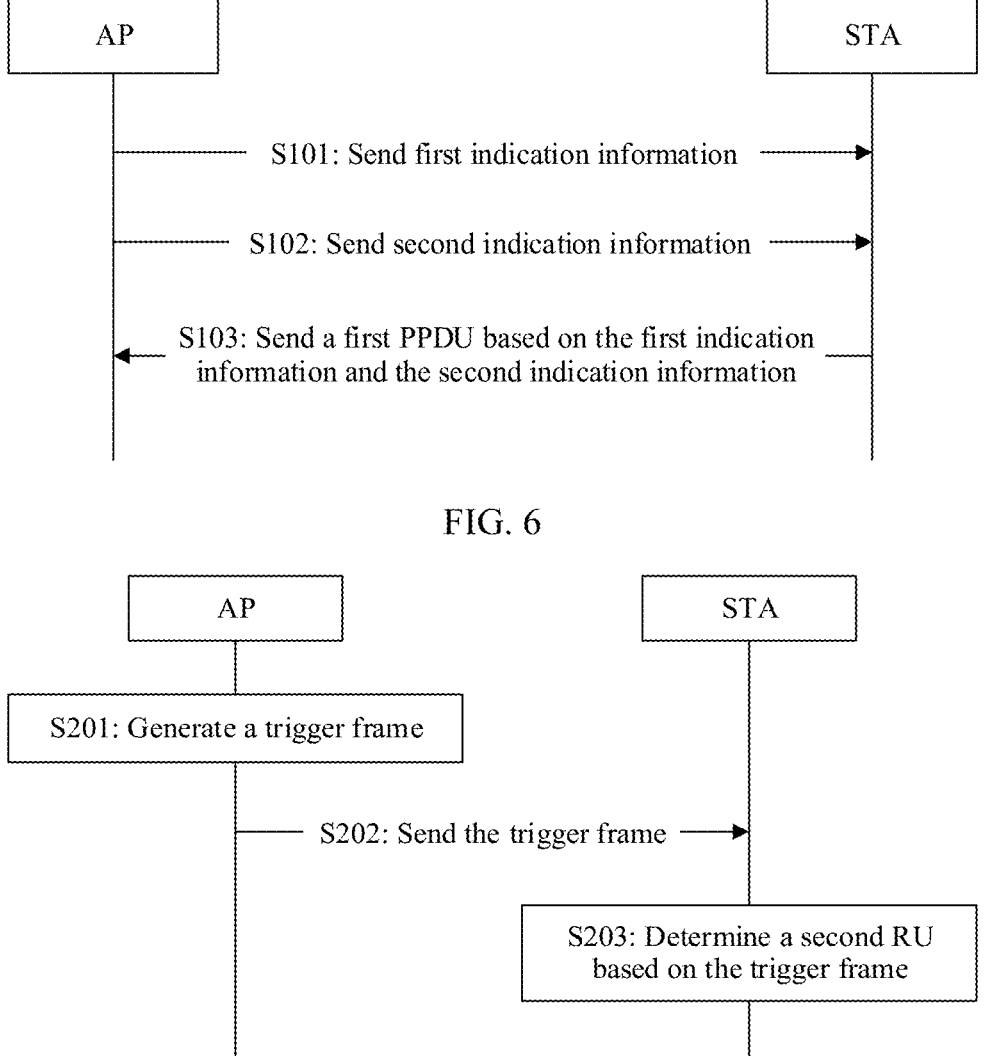
FIG. 6 is a schematic diagram of a communication method according to this application.
FIG. 7 is another schematic diagram of a communication method according to this application.

FIG. 6 is a schematic diagram of a communication method according to an embodiment of this application. The method includes the following operations.

S101: An AP sends first indication information.

In this embodiment, the AP sends the first indication information in operation S101, and correspondingly, the STA receives the first indication information in operation S101. The first indication information indicates a first RU of the STA.

In an embodiment, the first RU is an RU or MRU. In other words, the first RU indicated by the AP in operation S101 by using the first indication information may be an RU, or may be an MRU, so that the solution is applicable to different RU allocation scenarios. The first indication information may be implemented by using a resource unit allocation (RU Allocation) field in FIG. 2b, or may be implemented by using an RU Allocation field in FIG. 2d-1 and FIG. 2d-2, or indicates the first RU of the STA in another implementation. This is not limited herein.

In an embodiment, the first indication information is carried in a trigger frame, the trigger frame further includes third indication information, and the third indication information indicates that an LDPC extra symbol segment exists. Specifically, in operation S101, the first indication information that indicates the first RU of the STA to the STA is carried in the trigger frame, and the trigger frame further includes the third indication information that indicates that an LDPC extra symbol segment exists, so that a plurality of pieces of indication information are carried in a same trigger frame. This reduces overheads and further improves communication efficiency.

In an embodiment, the third indication information includes an LDPC extra symbol segment subfield, and when a value of the LDPC extra symbol segment subfield is 1, it indicates that an LDPC extra symbol segment exists.

In an embodiment, when the value of the LDPC extra symbol segment subfield is 0, it indicates that an LDPC extra symbol segment does not exist.

S102: The AP sends second indication information.

In this embodiment, the AP sends the second indication information in operation S102, and correspondingly, the STA receives the second indication information in operation S102. The second indication information indicates whether the STA is allowed to send a PPDU based on a part of the first RU, and when the second indication information indicates that the STA is allowed to send the PPDU based on the part of the first RU, the PPDU includes the LDPC extra symbol segment.

It should be noted that "when the second indication information indicates that the STA is allowed to send the PPDU based on the part of the first RU, the PPDU includes the LDPC extra symbol segment" may indicate that when the second indication information indicates that the STA is allowed to send the PPDU based on the part of the first RU and when the STA sends the PPDU based on the part of the first RU, the PPDU includes the LDPC extra symbol segment; may alternatively indicate that the second indication information indicates that the STA is allowed to send the PPDU based on the part of the first RU and the PPDU includes the LDPC extra symbol segment; and may alternatively indicate that the second indication information indicates that the STA is allowed to send the PPDU based on the part of the first RU and the second indication information further indicates that the PPDU includes the LDPC extra symbol segment.

In an embodiment, when the first indication information is carried in the trigger frame for sending in operation S101, the second indication information sent by the AP in operation S102 may also be associated with the trigger frame for sending. The trigger frame is carried in a second PPDU, and the second indication information is carried in the second PPDU. Specifically, the trigger frame that includes the first indication information and the third indication information is carried in the second PPDU, and the second indication information that is sent by the AP in operation S102 and that indicates whether the STA is allowed to send the PPDU based on the allocated part of the first RU is also carried in the second PPDU, so that the plurality of pieces of indication information are carried in a same PPDU. This reduces overheads and further improves communication efficiency.

In an embodiment, the second indication information may be represented as an adaptive RU allowed field, or the second indication information may be represented as an adaptive RU allowed subfield, or the second indication information may be represented as an adaptive TB PPDU allowed field, or the second indication information may be represented as an adaptive TB PPDU allowed subfield.

The following provides descriptions by using an example. As shown in the following Table 3, the second indication information is implemented by indicating a subfield (Adaptive RU Allowed subfield) that indicates whether an adaptive RU is allowed to be used, and the third indication information is implemented by indicating an LDPC extra symbol segment subfield ("LDPC Extra Symbol Segment field").

TABLE 3

| Adaptive RU Allowed subfield (Second indication information) | LDPC Extra Symbol Segment field (Third indication information) |
| --- | --- |
| 1 | 1 |
| 0 | 0 |
| 0 | 1 |

In Table 3, at least a second row of data is included, that is, a value of the Adaptive RU Allowed subfield is 1 and a value of the LDPC Extra Symbol Segment field is 1, indicating that the STA is allowed to send the PPDU based on the part of the first RU (or indicating that the adaptive RU is allowed to be used, or another indication, or the like) and indicating that the LDPC extra symbol segment exists (or indicating that the PPDU is sent based on a manner in which an LDPC extra symbol segment exists, or another indication, or the like).

In an embodiment, Table 3 further includes a third row of data, that is, the value of the Adaptive RU Allowed subfield is 0 and the value of the LDPC Extra Symbol Segment field is 0, indicating that the STA is not allowed to send the PPDU based on the part of the first RU (or indicating that the adaptive RU is not allowed to be used, or another indication, or the like) and indicating that the LDPC extra symbol segment does not exist (or indicating that the PPDU is not allowed to be sent based on the manner in which an LDPC extra symbol segment exists, or another indication, or the like).

In an embodiment, Table 3 further includes a fourth row of data, that is, the value of the Adaptive RU Allowed subfield is 0 and the value of the LDPC Extra Symbol Segment field is 1, indicating that the STA is not allowed to send the PPDU based on the part of the first RU (or indicating that the adaptive RU is not allowed to be used, or another indication, or the like) and indicating that the LDPC extra symbol segment exists (or indicating that the PPDU is allowed to be sent based on the method in which the LDPC extra symbol segment exists, or another indication, or the like).

In other words, according to an implementation process of Table 3, when the adaptive RU (or referred to as the adaptive TB PPDU) is allowed to exist, the LDPC Extra Symbol Segment subfield may only be equal to 1. In other words, when the adaptive RU (or referred to as the adaptive TB PPDU) is allowed to exist, the LDPC Extra Symbol Segment subfield is forbidden to be 0, that is, the LDPC extra symbol segment exists in the PPDU sent by the STA. When such configuration of the adaptive RU is not allowed, the value of the LDPC Extra Symbol Segment subfield may be equals to 1 or 0. An available mode is set, to avoid that the LDPC Extra Symbol Segment subfield being set to 1 when the adaptive resource unit is supported, to resolve the foregoing technical problem.

It should be noted that Table 3 is merely an implementation example. During actual application, the second indication information and the third indication information may alternatively be carried in another manner, for example, be indicated by reusing a same field, or another implementation. This is not limited herein.

In an embodiment, the second PPDU includes the first indication information that is different from the trigger frame, and the second indication information is carried in the first indication information. The first indication information may be a control frame, a management frame, information in a preamble, or the like. This is not limited herein.

In an embodiment, the second indication information and the third indication information may be alternatively implemented in another manner. The following provides descriptions by using Table 4.

TABLE 4

| Adaptive RU Allowed subfield (Second indication information) | LDPC Extra Symbol Segment field (Third indication information) |
| --- | --- |
| 1 | Reserved |
| 0 | 0 |
| 0 | 1 |

In Table 4, at least a second row of data is included, that is, the value of Adaptive RU Allowed subfield is 1 and the value of the LDPC Extra Symbol Segment field is Reserved. That is, the second indication information may indicate that the STA is allowed to send the PPDU based on the part of the first RU (or indicate that the adaptive RU is allowed to be used, or another indication, or the like) and indicate that the LDPC extra symbol segment exists (or indicate that the PPDU is sent based on a manner in which the LDPC extra symbol segment exists, or another indication, or the like). The third indication information is Reserved, so that when the value of the Adaptive RU Allowed subfield is 1, a meaning of the third indication information is Reserved. For example, in this case, the third indication information may indicate another meaning other than LDPC Extra Symbol Segment field. In this way, as long as the STA is in the operation S102 and the value of the Adaptive RU Allowed subfield in the second row of data sent by the AP or read by the STA is 1, it indicates that an adaptive RU is allowed, and an LDPC extra symbol segment exists.

In an embodiment, Table 4 further includes a third row of data, that is, the value of the Adaptive RU Allowed subfield is 0 and the value of the LDPC Extra Symbol Segment field is 0, indicating that the STA is not allowed to send the PPDU based on the part of the first RU (or indicating that the adaptive RU is not allowed to be used, or another indication, or the like) and indicating that the LDPC extra symbol segment does not exist (or indicating that the PPDU is not allowed to be sent based on the method in which the LDPC extra symbol segment exists, or another indication, or the like).

In an embodiment, Table 4 further includes a fourth row of data, that is, the value of the Adaptive RU Allowed subfield is 0 and the value of the LDPC Extra Symbol Segment field is 1, indicating that the STA is not allowed to send the PPDU based on the part of the first RU (or indicating that the adaptive RU is not allowed to be used, or another indication, or the like) and indicating that the LDPC extra symbol segment exists (or indicating that the PPDU is allowed to be sent based on the method in which the LDPC extra symbol segment exists, or another indication, or the like).

It should be noted that the value of the field is merely an example, and the second indication information and the third indication information may alternatively be implemented by using another field name or another value. This is not limited herein.

In an embodiment, the second indication information and the third indication information may be alternatively implemented in another manner. A same field (or a bit) may indicate both the second indication information and the third indication information. For example, the LDPC Extra Symbol segment field and the Adaptive RU allowed subfield may be combined, that is, the Adaptive RU Allowed subfield does not exist, and only the LDPC Extra Symbol segment field indicates the second indication information and the third indication information.

For example, when the value of the LDPC Extra Symbol Segment field is 1, it indicates that an LDPC extra symbol segment exists, and the adaptive RU (or referred to as the adaptive TB PPDU) is allowed.

In an embodiment, when the value of the LDPC Extra Symbol Segment field is 0, it indicates that an LDPC extra symbol segment does not exist and the adaptive RU (or referred to as the adaptive TB PPDU) is allowed, or when the value of the LDPC Extra Symbol Segment field is 0, it indicates that an LDPC extra symbol segment does not exist and the adaptive RU (or referred to as the adaptive TB PPDU) is not allowed.

It should be noted that the value of the field is merely an example, and the second indication information and the third indication information may alternatively be implemented by using another field name or another value. This is not limited herein.

S103: The STA sends the first PPDU based on the first indication information and the second indication information.

In this embodiment, in operation S103, the STA sends the first PPDU based on the first indication information that is received in operation S101 and the second indication information that is received in operation S102. Correspondingly, the AP receives the first PPDU in operation S103. The second RU occupied by the first PPDU is the part of the first RU, and the first PPDU includes the LDPC extra symbol segment.

In an embodiment, the second RU occupied by the first PPDU is an RU, or the second RU occupied by the first PPDU is an MRU.

In an embodiment, in operation S103, in addition to the first indication information and the second indication information, determining bases for the STA to determine the second RU occupied by the first PPDU may further include another determining basis. For example, in the manners shown in FIG. 3a and FIG. 3b, the STA uses whether a channel corresponding to the RU is an idle channel as a determining basis, or the STA uses a result of carrier sensing or a result of channel sounding as a determining basis, or another implementation. This is not limited herein.

In an embodiment, the first PPDU sent by the STA in operation S103 includes fourth indication information, and the fourth indication information indicates whether the first PPDU includes the extra symbol segment of the LDPC. Specifically, after receiving the first PPDU from the STA, the AP may further determine, based on the fourth indication information in the first PPDU, whether a configuration manner of the first PPDU includes the LDPC extra symbol segment, so that the AP subsequently parses the first PPDU based on the fourth indication information. This improves a success rate of parsing the first PPDU on the AP side, and further improves communication efficiency.

In an embodiment, in operation S103, after the AP receives the first PPDU, the method may further include: First, the AP determines the configuration manner of the first PPDU based on a size of the first PPDU, where the configuration manner includes configuring the first PPDU based on a manner in which an LDPC extra symbol segment exists. Then, the AP parses the PPDU based on the configuration manner. Specifically, after receiving the first PPDU from the STA in operation S103, the AP may further determine, based on the size of the first PPDU, that the configuration manner of the first PPDU is configuring the first PPDU based on a manner in which an LDPC extra symbol segment exists, so that the AP parses the first PPDU based on the configuration manner. The AP is prevented from parsing the first PPDU based on a configuration manner that is not based on a manner in which an LDPC extra symbol segment exists. This improves a success rate of parsing the first PPDU on the AP side, and further improves communication efficiency.

In an embodiment, the configuration manner further includes: not configuring the first PPDU based on the manner in which an LDPC extra symbol segment exists.

In an embodiment, that the AP parses the PPDU based on the configuration manner may also means that the AP decodes the PPDU based on the configuration manner.

In an embodiment, the LDPC extra symbol segment includes an extra symbol segment of a post-forward error correction padding (post-FEC padding) type. Specifically, symbol segments used in the EHT include different types. A difference between a current implementation in which only an extra symbol segment of a pre-forward error correction padding (pre-FEC padding) type may be used in the EHT and the embodiment lies in that, in the embodiment, the LDPC extra symbol segment is further extended, so that the extra symbol segment of the post-FEC padding type is used. This further improves communication efficiency.

Specifically, as shown in FIG. 5, a number of tones supported by each symbol in the EHT is approximately five times a number of tones supported by each symbol in the HT. Therefore, in a current LDPC encoding process of the EHT, it is generally considered that data bits carried in a part of one symbol (for example, 1/4 symbol when a value of a is 1, 2/4 symbols when a value of a is 2, and 3/4 symbols when a value of a is 3) of the EHT are sufficient to accommodate data bits carried in one symbol of the HT. For example, an implementation in which the value of a is 1 in FIG. 5 is used as an example. A part of a 1/4 symbol (for example, a pre-FEC padding part in FIG. 5) is used as the extra symbol segment, and a remaining part (for example, a post-FEC padding part in FIG. 5) is generally not used to carry valid information, so that duration (that is, 3/4 symbols) corresponding to the post-FEC padding is reserved for a receive side, and more processing time is provided for a receiver.

However, in the foregoing implementation, the extra symbol segment is extended in a post-FEC padding manner. For example, when the extra symbol segment needs to be coded to generate the PPDU, $a_{init}$ and $N_{SYM,init}$ used in Formula (8) to Formula (12) are still equal to a and $N_{SYM}$ that are configured by the AP in the trigger frame, that is, the updating process in which 1 is subtracted from the value of $N_{SYM}$ or 1 is subtracted from the value of $a_{init}$ in Formula (14) does not need to be performed. In addition, in operation D, updating is always performed by using Formula (13), that is, the symbol segment is extended based on conditions that when a<4 (or $a_{init}$<4), a+1 (or $a_{init}$+1) and the symbol remains unchanged. In this way, the extra symbol segment may also be obtained.

In an embodiment, when a=4 (or $a_{init}$=4), the post-FEC padding does not exist, and the extra symbol segment may not be obtained by using this part. Therefore, when a=4 (or $a_{init}$=4), the extra symbol segment is not obtained by using the post-FEC padding.

In an embodiment, the LDPC extra symbol segment includes an extra symbol segment of a pre-FEC padding type.

Based on the embodiment shown in FIG. 6, the second indication information sent by the AP in operation S102 indicates whether the STA is allowed to send the PPDU based on the allocated part of the first RU, and when the second indication information indicates that the STA is allowed to send the PPDU based on the part of the first RU, the PPDU includes the LDPC extra symbol segment. In other words, when the STA sends the PPDU based on the part of the first RU that is allocated by the first indication information in operation S103, the PPDU is configured based on the LDPC extra symbol segment, so that the STA performs transmission on the adaptive RU based on the LDPC extra symbol segment Therefore, a case is avoided in which when the AP specifies that the STA does not perform transmission based on a symbol segment, decoding performance is reduced on an AP side because the STA does not adapt to the specification when performing transmission on the adaptive RU. This improves WLAN communication efficiency.

FIG. 7 is a schematic diagram of a communication method according to an embodiment of this application. The method includes the following operations.

S201: An AP generates a trigger frame.

In this embodiment, the AP generates the trigger frame in operation S201. The trigger frame includes first indication information and third indication information, the first indication information indicates a first RU of a STA, and the third indication information indicates whether an LDPC extra symbol segment exists.

S202: The AP sends the trigger frame.

In this embodiment, the AP sends, in operation S202, the trigger frame generated in operation S201, and correspondingly, the STA receives the trigger frame in operation S202.

Specifically, for implementation processes of operation S201 and operation S202, refer to the implementation processes of operation S101 and operation S102 (when both the first indication information and the third indication information are carried in the trigger frame). Details are not described herein again.

S203: The STA determines a second RU based on the trigger frame.

In this embodiment, in operation S203, the STA determines the second RU based on the trigger frame that is received in operation S202. The second RU is a part of the first RU. When the third indication information indicates that an LDPC extra symbol segment does not exist and when a first PPDU is sent based on the second RU, the first PPDU is a PPDU that does not require an LDPC extra symbol segment.

In an embodiment, the second RU is an RU, or the second RU is an MRU.

In an embodiment, in operation S203, in addition to the trigger frame, determining bases for the STA to determine the second RU may further include another determining basis. For example, in the manners shown in FIG. 3a and FIG. 3b, the STA uses whether a channel corresponding to the RU is an idle channel as a determining basis, or the STA uses a result of carrier sensing or a result of channel sounding as a determining basis, or another implementation. This is not limited herein.

In addition, an adaptive PPDU (or referred to as an adaptive TB PPDU) mentioned in any embodiment of this application is a PPDU (or referred to as a TB PPDU) sent based on the adaptive RU, and indicates that the STA sends the PPDU (or referred to as the TB PPDU) based on an adaptive RU resource.

Specifically, when an LDPC Extra Symbol Segment subfield in the trigger frame sent by the AP is set to 0 (that is, the third indication information indicates that the extra symbol segment of the LDPC does not exist), when sending the first PPDU based on the adaptive RU in operation S203, the STA needs to select an adaptive RU that does not require an extra symbol segment, and sends the first PPDU based on the adaptive RU that does not require an extra symbol segment. That is, in a process in which the STA performs LDPC encoding on to-be-sent data to generate the first PPDU, the STA does not need to perform the updating process shown in Formula (13) or Formula (14) to generate the first PPDU through encoding. Therefore, using an adaptive TB PPDU that requires an extra segment is avoided, to resolve the foregoing technical problem.

In a process in which the STA selects the adaptive RU, whether the extra symbol segment is required is still determined by a condition that whether excess puncturing is performed in operation D. For details, refer to the description of the condition 1, the condition 2, the condition 3, or the condition 4. Details are not described herein again.

In an embodiment, the STA needs to select the adaptive RU (or referred to as the adaptive TB PPDU) selected in operation S203, that is, the second RU, from an RU set whose corresponding LDPC Extra Symbol Segment subfield value is 0, or in other words, does not select the adaptive RU from an RU set whose LDPC Extra Symbol Segment subfield value is 1.

In an embodiment, when the LDPC Extra Symbol Segment subfield in the trigger frame sent by the AP is set to 1 (that is, the third indication information indicates that an LDPC extra symbol segment exists), the STA selects the adaptive RU without limits when sending the PPDU based on the adaptive RU in operation S203.

In an embodiment, a manner in which the STA selects the adaptive RU that does not require an extra symbol segment may be as follows: selecting for sending, from a supported TB PPDU, the adaptive RU that does not require an extra symbol segment; or selecting for sending, from a supported TB PPDU, an adaptive RU that does not require an extra symbol segment and that is of a largest RU size; or selecting for sending, from a supported TB PPDU, an adaptive RU that does not require an extra symbol segment and that is of a smallest RU size; or another implementation. This is not limited herein.

In an embodiment, if the STA determines, in operation S203, that the adaptive RU that does not require an extra symbol segment does not exist, the STA does not send the adaptive RU.

In an embodiment, the first PPDU sent by the STA based on the second RU in operation S203 includes fourth indication information, and the fourth indication information indicates whether the first PPDU includes the LDPC extra symbol segment. Specifically, after receiving the first PPDU from the STA, the AP may further determine, based on the fourth indication information in the first PPDU, whether a configuration manner of the first PPDU includes the LDPC extra symbol segment, so that the AP subsequently parses the first PPDU based on the fourth indication information. This improves a success rate of parsing the first PPDU on the AP side, and further improves communication efficiency.

In an embodiment, in operation S203, after the STA sends the first PPDU based on the second RU in operation S203, that is, after the AP receives the first PPDU in operation S203, the method may further include: first, the AP determines the configuration manner of the first PPDU based on a size of the first PPDU, where the configuration manner includes configuring the first PPDU based on a manner in which an LDPC extra symbol segment exists. Then, the AP parses the PPDU based on the configuration manner. Specifically, after receiving the first PPDU from the STA in operation S203, the AP may further determine, based on the size of the first PPDU, that the configuration manner of the first PPDU is configuring the first PPDU based on the manner in which an LDPC extra symbol segment exists, so that the AP parses the first PPDU based on the configuration manner. The AP is prevented from parsing the first PPDU based on the configuration manner in which the first PPDU is not configured based on the manner in which an LDPC extra symbol segment exists. This improves a success rate of parsing the first PPDU on the AP side, and further improves communication efficiency.

In an embodiment, the configuration manner further includes not configuring the first PPDU based on the manner in which an LDPC extra symbol segment exists.

In an embodiment, that the AP parses the PPDU based on the configuration manner may also means that the AP decodes the PPDU based on the configuration manner.

In an embodiment, the LDPC extra symbol segment includes an extra symbol segment of a post-FEC padding type. Specifically, symbol segments used in the EHT include different types. A difference between a current implementation in which only an extra symbol segment of a pre-FEC padding type may be used in the EHT and the embodiment lies in that, in the embodiment, the LDPC extra symbol segment is further extended, so that the extra symbol segment of the post-FEC padding type may be used. This further improves communication efficiency.

Specifically, as shown in FIG. 5, a number of tones supported by each symbol in the EHT is approximately five times that in the HT. Therefore, in a current LDPC encoding process of the EHT, it is generally considered that data bits carried in a part of one symbol (for example, 1/4 symbol when a value of a is 1, 2/4 symbols when a value of a is 2, and 3/4 symbols when a value of a is 3) of the EHT are sufficient to accommodate data bits carried in one symbol of the HT. For example, an implementation in which the value of a is 1 in FIG. 5 is used as an example. A part of a 1/4 symbol (for example, a pre-FEC padding part in FIG. 5) is used as the extra symbol segment, and a remaining part (for example, a post-FEC padding part in FIG. 5) is generally not used to carry valid information, so that duration (that is, 3/4 symbols) corresponding to the post-FEC padding is reserved for a receive side, and more processing time is provided for a receiver.

However, in the foregoing implementation, the extra symbol segment is extended in a post-FEC padding manner. For example, when the extra symbol segment needs to be coded to generate the PPDU, $a_{init}$ and $N_{SYM,init}$ used in Formula (8) to Formula (12) are still equal to a and $N_{SYM}$ that are configured by the AP in the trigger frame, that is, the updating process in which 1 is subtracted from the value of $N_{SYM}$ or 1 is subtracted from the value of $a_{init}$ in Formula (14) does not need to be performed. In addition, in operation D, updating is always performed by using Formula (13), that is, the symbol segment is extended based on conditions that when a<4 (or $a_{init}<4$), a+1 (or $a_{init}+1$) and the symbol remains unchanged. In this way, the extra symbol segment may also be obtained.

In an embodiment, when a=4 (or $a_{init}=4$), the post-FEC padding does not exist, and the extra symbol segment may not be obtained by using this part. Therefore, when a=4 (or $a_{init}=4$), the extra symbol segment is not obtained by using the post-FEC padding.

In an embodiment, the LDPC extra symbol segment includes an extra symbol segment of a pre-FEC padding type.

Based on the embodiment shown in FIG. 7, in operation S201 and operation S202, the trigger frame generated and sent by the AP includes the first indication information that indicates the first RU of the STA and the third indication information that indicates whether the LDPC extra symbol segment exists. Then, when the STA determines, based on the trigger frame in operation S203, that the part of the first RU is used to transmit the first PPDU, the first PPDU is a PPDU that does not require an LDPC extra symbol segment. In other words, when the STA selects the adaptive RU based on the allocated first RU in operation S203, the STA selects an adaptive RU corresponding to the PPDU that does not require an LDPC extra symbol segment, and transmits the first PPDU based on the adaptive RU. Therefore, a case is avoided in which when the AP specifies that the STA does not perform transmission based on a symbol segment, decoding performance is reduced on an AP side because the STA does not adapt to the specification when performing transmission on the adaptive RU, so that the STA adapts to the specification of the AP when the STA transmits the PPDU based on the adaptive RU. This improves WLAN communication efficiency.

Figure 8:
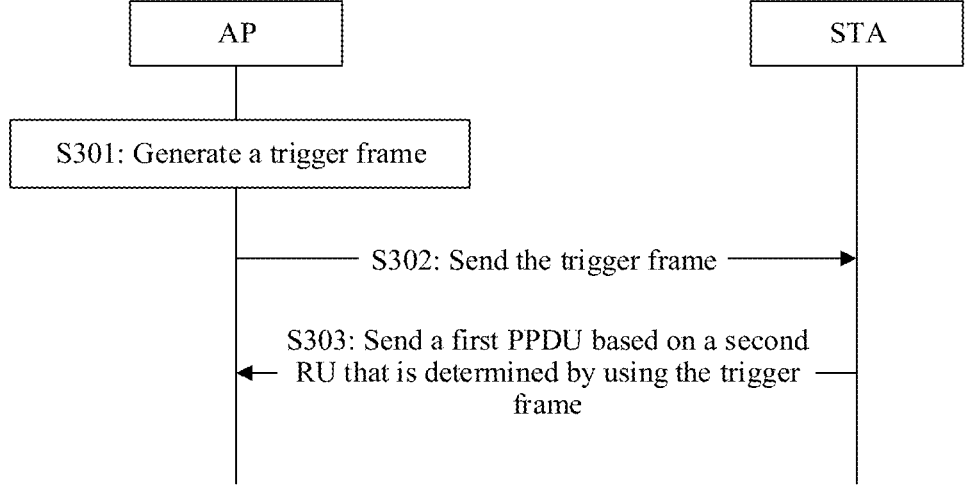
FIG. 8 is another schematic diagram of a communication method according to this application.

FIG. 8 is a schematic diagram of a communication method according to an embodiment of this application. The method includes the following operations.

S301: An AP generates a trigger frame.

In this embodiment, the AP generates the trigger frame in operation S301, where the trigger frame includes first indication information, and the first indication information indicates a first RU of a STA.

S302: The AP sends the trigger frame.

In this embodiment, the AP sends, in operation S302, the trigger frame generated in operation S301, and correspondingly, the STA receives the trigger frame in operation S302.

Specifically, for implementation processes of operation S301 and operation S302, refer to the implementation processes of operation S101 and operation S102 (when the first indication information is carried in the trigger frame). Details are not described herein again.

S303: The STA sends a first PPDU based on a second RU that is determined by using the trigger frame.

In this embodiment, in operation S303, the STA sends the first PPDU based on the second RU that is determined by using the trigger frame received in operation S302. Correspondingly, the AP receives the first PPDU in operation S303. The first PPDU includes an LDPC extra symbol segment, and the second RU is a part of the first RU.

In an embodiment, the second RU is an RU, or the second RU is an MRU.

In an embodiment, in operation S303, in addition to the trigger frame, determining bases for the STA to determine the second RU may further include another determining basis. For example, in the manners shown in FIG. 3a and FIG. 3b, the STA uses whether a channel corresponding to the RU is an idle channel as a determining basis, or the STA uses a result of carrier sensing or a result of channel sounding as a determining basis, or another implementation. This is not limited herein.

Specifically, when the STA determines, in operation S303, to send the first PPDU based on the adaptive RU, regardless of how the LDPC Extra Symbol Segment subfield in the trigger frame sent by the AP in operation S302 is set (that is, regardless of an indication of the third indication information), the PPDU that is sent by the STA in operation S303 based on the adaptive RU is configured in a manner in which the LDPC Extra Symbol Segment subfield is equal to 1, that is, $N_{SYM}$ and a are always obtained by using a manner of Formula (14). Correspondingly, in an encoding process in which the STA performs encoding based on the to-be-sent data to obtain the first PPDU, it is always considered that updating is needed in operation D, that is, the extra symbol segment is always added in operation D (indicating that fewer bits need to be punctured), and a determining process of the foregoing conditions (for example, the condition 1, the condition 2, the condition 3, or the condition 4) does not need to be performed. In other words, when the STA sends the first PPDU based on the adaptive RU in operation S303, the STA always performs encoding based on a manner in which an extra symbol segment exists, to obtain the first PPDU.

In an embodiment, the first PPDU sent by the STA based on the second RU in operation S303 includes fourth indication information, and the fourth indication information indicates whether the first PPDU includes the LDPC extra symbol segment. Specifically, after receiving the first PPDU from the STA, the AP may further determine, based on the fourth indication information in the first PPDU, whether a configuration manner of the first PPDU includes the LDPC extra symbol segment, so that the AP subsequently parses the first PPDU based on the fourth indication information. This improves a success rate of parsing the first PPDU on the AP side, and further improves communication efficiency.

In an embodiment, in operation S303, after the STA sends the first PPDU based on the second RU in operation S303, that is, after the AP receives the first PPDU in operation S303, the method may further include: First, the AP determines the configuration manner of the first PPDU based on a size of the first PPDU, where the configuration manner includes configuring the first PPDU based on a manner in which an LDPC extra symbol segment exists. Then, the AP parses the PPDU based on the configuration manner. Specifically, after receiving the first PPDU from the STA in operation S303, the AP may further determine, based on the size of the first PPDU, that the configuration manner of the first PPDU is configuring the first PPDU based on the manner in which an LDPC extra symbol segment exists, so that the AP parses the first PPDU based on the configuration manner. The AP is prevented from parsing the first PPDU based on the configuration manner in which the first PPDU is not configured based on the manner in which an LDPC extra symbol segment exists. This improves a success rate of parsing the first PPDU on the AP side, and further improves communication efficiency.

In an embodiment, the configuration manner further includes not configuring the first PPDU based on the manner in which an LDPC extra symbol segment exists.

In an embodiment, that the AP parses the PPDU based on the configuration manner may also means that the AP decodes the PPDU based on the configuration manner.

In an embodiment, the LDPC extra symbol segment includes an extra symbol segment of a post-FEC padding type. Specifically, symbol segments used in the EHT include different types. A difference between a current implementation in which only an extra symbol segment of a pre-FEC padding type may be used in the EHT and the embodiment lies in that, in the embodiment, the LDPC extra symbol segment is further extended, so that the extra symbol segment of the post-FEC padding type may be used. This further improves communication efficiency.

Specifically, as shown in FIG. 5, a number of tones supported by each symbol in the EHT is approximately five times that in the HT. Therefore, in a current LDPC encoding process of the EHT, it is generally considered that data bits carried in a part of one symbol (for example, 1/4 symbol when a value of a is 1, 2/4 symbols when a value of a is 2, and 3/4 symbols when a value of a is 3) of the EHT are sufficient to accommodate data bits carried in one symbol of the HT. For example, an implementation in which the value of a is 1 in FIG. 5 is used as an example. A part of a 1/4 symbol (for example, a pre-FEC padding part in FIG. 5) is used as the extra symbol segment, and a remaining part (for example, a post-FEC padding part in FIG. 5) is generally not used to carry valid information, so that duration (that is, 3/4 symbols) corresponding to the post-FEC padding is reserved for a receive side, and more processing time is provided for a receiver.

However, in the foregoing implementation, the extra symbol segment is extended in a post-FEC padding manner. For example, when the extra symbol segment needs to be coded to generate the PPDU, $a_{init}$ and $N_{SYM,init}$ used in Formula (8) to Formula (12) are still equal to a and $N_{SYM}$ that are configured by the AP in the trigger frame, that is, the updating process in which 1 is subtracted from the value of $N_{SYM}$ or 1 is subtracted from the value of $a_{init}$ in Formula (14) does not need to be performed. In addition, in operation D, updating is always performed by using Formula (13), that is, the symbol segment is extended based on conditions that when a<4 (or $a_{init}$<4), a+1 (or $a_{init}$+1) and the symbol remains unchanged. In this way, the extra symbol segment may also be obtained.

In an embodiment, when a=4 (or $a_{init}$=4), the post-FEC padding does not exist, and the extra symbol segment may not be obtained by using this part. Therefore, when a=4 (or $a_{init}$=4), the extra symbol segment is not obtained by using the post-FEC padding.

In an embodiment, the LDPC extra symbol segment includes an extra symbol segment of a pre-FEC padding type.

According to the implementation shown in FIG. 8, the trigger frame received by the STA in operation S302 includes the first indication information that indicates the first RU of the STA. Then, when the STA transmits the first PPDU in operation S303 based on the second RU that is determined by using the trigger frame, the first PPDU includes the LDPC extra symbol segment, and the second RU is the part of the first RU. In other words, when the STA selects the second RU as the adaptive RU based on the allocated first RU in operation S303, the first PPDU transmitted by the STA on the adaptive RU includes the LDPC extra symbol segment. Therefore, a case is avoided in which when the AP specifies whether the STA performs transmission based on a symbol segment, communication efficiency is low because the STA does not adapt to the specification when performing transmission on the adaptive RU, so that the PPDU transmitted by the STA based on the adaptive RU includes the LDPC extra symbol segment. This improves WLAN communication efficiency.

Figure 9:
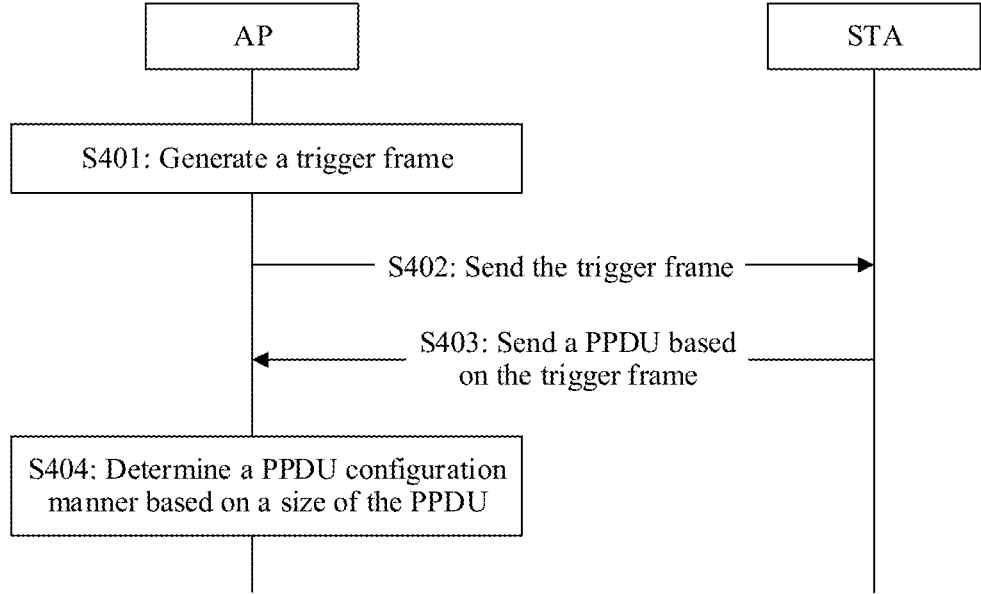
FIG. 9 is another schematic diagram of a communication method according to this application.

FIG. 9 is a schematic diagram of a communication method according to an embodiment of this application. The method includes the following operations.

S401: An AP generates a trigger frame.

In this embodiment, the AP generates the trigger frame in operation S401, where the trigger frame includes first indication information, and the first indication information indicates a first RU of a STA.

S402: The AP sends the trigger frame.

In this embodiment, the AP sends, in operation S402, the trigger frame generated in operation S401, and correspondingly, the STA receives the trigger frame in operation S402.

Specifically, for implementation processes of operation S401 and operation S402, refer to the implementation processes of operation S101 and operation S102 (when the first indication information is carried in the trigger frame). Details are not described herein again.

S403: The STA sends a PPDU based on the trigger frame.

In this embodiment, in operation S403, the STA sends the PPDU based on the trigger frame that is received in operation S402. Correspondingly, the AP receives the PPDU in operation S403.

Specifically, an implementation in which the STA sends the PPDU in operation S403 may be the implementation in operation S103; or an implementation in which the PPDU is sent by using the second RU that is determined in operation S203; or an implementation in which the first PPDU is sent by using the second RU that is determined by using the trigger frame in operation S303; or an implementation in which the PPDU is sent by using a current manner in which the AP in the EHT may indicate $N_{SYM}$ and a to the STA by using the trigger frame, or another implementation. This is not limited herein.

In an embodiment, in operation S403, if the PPDU sent by the STA is a PPDU that is sent based on the second RU in the first RU that is indicated by the trigger frame, the second RU is an RU, or the second RU is an MRU.

In an embodiment, in operation S403, in addition to the trigger frame, determining bases for the STA to determine the second RU may further include another determining basis. For example, in the manners shown in FIG. 3a and FIG. 3b, the STA uses whether a channel corresponding to the RU is an idle channel as a determining basis, or the STA uses a result of carrier sensing or a result of channel sounding as a determining basis, or another implementation. This is not limited herein.

S404: The AP determines a PPDU configuration manner based on a size of the PPDU.

In this embodiment, the AP determines the PPDU configuration manner based on a size of the PPDU that is received in operation S403. The configuration manner includes configuring the PPDU based on a manner in which an LDPC extra symbol segment exists, and the configuration manner includes not configuring the PPDU based on the manner in which an LDPC extra symbol segment exists.

Specifically, in operation S404, the AP determines the configuration manner of the PPDU based on the size of the PPDU that is received in operation S403, where the configuration manner includes configuring the PPDU based on the manner in which an LDPC extra symbol segment exists. Then, the AP parses the PPDU based on the configuration manner. In this way, the AP is prevented from parsing the first PPDU based on a configuration manner in which the first PPDU is not configured in the manner in which an LDPC extra symbol segment exists. This improves a success rate of parsing the first PPDU on the AP side, and further improves communication efficiency.

In an embodiment, the configuration manner further includes not configuring the first PPDU based on the manner in which an LDPC extra symbol segment exists.

In an embodiment, that the AP parses the PPDU based on the configuration manner may also means that the AP decodes the PPDU based on the configuration manner.

Specifically, if the AP sets a value of the LDPC Extra Symbol Segment subfield in the trigger frame that is sent in operation S402 to 0 (that is, the third indication information indicates that an extra symbol segment does not exist), after the AP receives, in operation S403, the PPDU that is sent by the STA based on an adaptive RU, in operation S404, the AP determines, based on the size of the PPDU, a configuration used by the station, that is, a configuration in which the LDPC Extra Symbol Segment subfield is equal to 1 or a configuration in which the LDPC Extra Symbol Segment subfield is equal to 0 is used. The determining process may be performed by using the foregoing described conditions (for example, the condition 1, the condition 2, the condition 3, or the condition 4). Details are not described herein again.

In other words, in an encoding process of performing LDPC encoding on the to-be-sent data in operation S403 to obtain the PPDU, a and $N_{SYM}$ return to $a_{init}$ and $N_{SYM,init}$ (in Formula (8) and Formula (9)) and then 1 is added back to $a_{init}$ and $N_{SYM,init}$ (in Formula (13)) and that is described in the TB PPDU, but first attempts to determine whether excess puncturing is performed when using the configuration in which LDPC Extra Symbol Segment subfield is equal to 0 (whether excess puncturing is performed is determined based on the foregoing conditions, and if the conditions are met, excess puncturing is performed). If excess puncturing is performed, the configuration in which the LDPC Extra Symbol Segment subfield is equal to 1 is used. Because the AP also learns a size of the adaptive RU when receiving the TB PPDU in operation S403, the AP may also determine in operation S404 based on the foregoing described conditions that if the configuration of 0 is used, excess puncturing is performed. In this case, it may be considered that the adaptive TB PPDU uses a configuration in which the extra symbol segment is used.

In an embodiment, if the PPDU sent by the STA in operation S403 is the LDPC extra symbol segment, the LDPC extra symbol segment may include an extra symbol segment of a post-FEC padding type. Specifically, symbol segments used in the EHT include different types. A difference between a current implementation in which only an extra symbol segment of a pre-FEC padding type may be used in the EHT and the embodiment lies in that, in the embodiment, the LDPC extra symbol segment is further extended, so that the extra symbol segment of the post-FEC padding type may be used. This further improves communication efficiency.

Specifically, as shown in FIG. 5, a number of tones supported by each symbol in the EHT is approximately five times that in the HT. Therefore, in a current LDPC encoding process of the EHT, it is generally considered that data bits carried in a part of one symbol (for example, 1/4 symbol when a value of a is 1, 2/4 symbols when a value of a is 2, and 3/4 symbols when a value of a is 3) of the EHT are sufficient to accommodate data bits carried in one symbol of the HT. For example, an implementation in which the value of a is 1 in FIG. 5 is used as an example. A part of a 1/4 symbol (for example, a pre-FEC padding part in FIG. 5) is used as the extra symbol segment, and a remaining part (for example, a post-FEC padding part in FIG. 5) is generally not used to carry valid information, so that duration (that is, 3/4 symbols) corresponding to the post-FEC padding is reserved for a receive side, and more processing time is provided for a receiver.

However, in the foregoing implementation, the extra symbol segment is extended in a post-FEC padding manner. For example, when the extra symbol segment needs to be coded to generate the PPDU, $a_{init}$ and $N_{SYM,init}$ used in Formula (8) to Formula (12) are still equal to a and $N_{SYM}$ that are configured by the AP in the trigger frame, that is, the updating process in which 1 is subtracted from the value of $N_{SYM}$ or 1 is subtracted from the value of $a_{init}$ in Formula (14) does not need to be performed. In addition, in operation D, updating is always performed by using Formula (13), that is, the symbol segment is extended based on conditions that when a<4 (or $a_{init}$<4), a+1 (or $a_{init}$+1) and the symbol remains unchanged. In this way, the extra symbol segment may also be obtained.

In an embodiment, when a=4 (or $a_{init}$=4), the post-FEC padding does not exist, and the extra symbol segment may not be obtained by using this part. Therefore, when a=4 (or $a_{init}$=4), the extra symbol segment is not obtained by using the post-FEC padding.

In an embodiment, the LDPC extra symbol segment includes an extra symbol segment of a pre-FEC padding type.

Figures 10, 11:
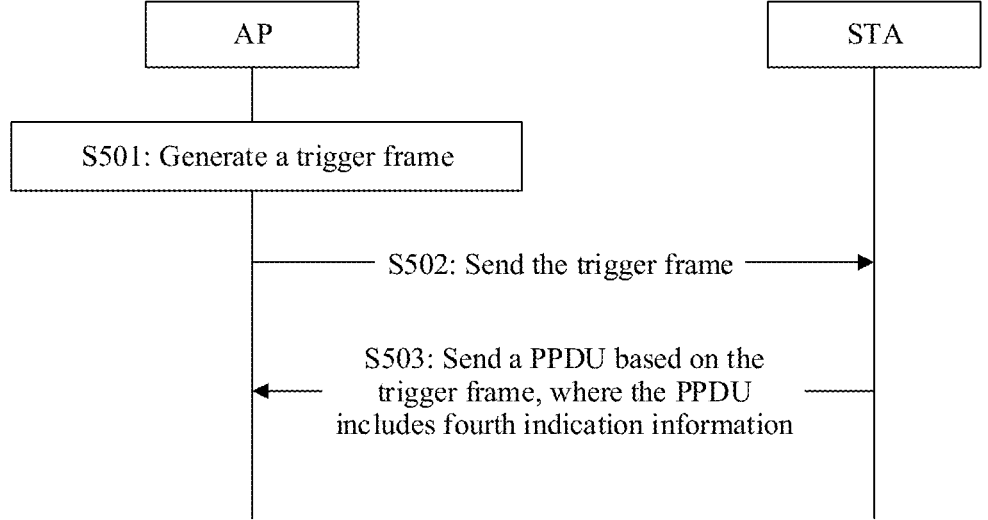
FIG. 10 is another schematic diagram of a communication method according to this application.
FIG. 11 is a schematic diagram of a communication apparatus according to this application.

FIG. 10 is a schematic diagram of a communication method according to an embodiment of this application. The method includes the following operations.

S501: An AP generates a trigger frame.

In this embodiment, the AP generates the trigger frame in operation S501, where the trigger frame includes first indication information, and the first indication information indicates a first RU of a STA.

S502: The AP sends the trigger frame.

In this embodiment, the AP sends, in operation S502, the trigger frame generated in operation S501, and correspondingly, the STA receives the trigger frame in operation S502.

Specifically, for implementation processes of operation S501 and operation S502, refer to the implementation processes of operation S101 and operation S102 (when the first indication information is carried in the trigger frame). Details are not described herein again.

S503: The STA sends a PPDU based on the trigger frame.

In this embodiment, in operation S503, the STA sends the PPDU based on the trigger frame that is received in operation S502. Correspondingly, the AP receives the PPDU in operation S403. The PPDU includes fourth indication information, and the fourth indication information indicates whether the PPDU includes the LDPC extra symbol segment. In operation S503, the STA may send the PPDU based on a part of the first RU indicated by the trigger frame.

In an embodiment, in operation S503, if the PPDU sent by the STA is a PPDU sent based on the part of the first RU that is indicated by the trigger frame, the part of the first RU is an RU, or the part of the first RU is an MRU.

In an embodiment, in operation S503, in addition to the trigger frame, determining bases for the STA to determine the part of the first RU may further include another determining basis. For example, in the manners shown in FIG. 3a and FIG. 3b, the STA uses whether a channel corresponding to the RU is an idle channel as a determining basis, or the STA uses a result of carrier sensing or a result of channel sounding as a determining basis, or another implementation. This is not limited herein.

In an embodiment, when the STA sends the PPDU in operation S503, an LDPC Extra Symbol Segment indication (that is, the fourth indication information) exists in the PPDU, and the AP may be notified of a configuration manner of the PPDU.

For example, when a value of the LDPC Extra Symbol Segment indication is 1, it indicates that the STA generates the PPDU through encoding based on the updating process shown in Formula (13) or Formula (14), that is, in a process of generating the PPDU through encoding, parameters $a_{init}$ and $N_{SYM,init}$ used are not a and $N_{SYM}$ configured by the AP in the trigger frame in operation S502. When the value of the LDPC Extra Symbol Segment indication is 0, it indicates that the STA does not generate the PPDU through encoding based on the updating process shown in Formula (13) or Formula (14), that is, in a process of generating the PPDU through encoding, parameters $a_{init}$ and $N_{SYM,init}$ used are a and $N_{SYM}$ configured by the AP in operation S502 by the trigger frame.

It should be noted that a value of the field is merely an example, and the fourth indication information may be alternatively implemented by using another field name or a value of the field, for example, when the value of the LDPC Extra Symbol Segment is 0, the STA is indicated to send the PPDU based on a manner in which an LDPC extra symbol segment exists in operation S503; for another example, when the value of the LDPC Extra Symbol Segment is 1, the STA is indicated to send the PPDU based on the manner in which an LDPC extra symbol segment exists in operation S503; or another implementation. This is not limited herein.

In other words, if the AP sets a value of the LDPC Extra Symbol Segment subfield in the trigger frame that is sent in operation S502 to 0 (that is, the third indication information in the trigger frame indicates that an LDPC extra symbol segment does not exist), in operation S503, the STA of the PPDU that is sent based on the adaptive RU may still determine, by itself, whether to use a configuration of 0 or 1 (that is, the STA determines, whether to generate the PPDU based on an LDPC extra symbol segment encoding manner), and notifies the AP of the configuration in the fourth indication information in the PPDU.

In an embodiment, if the STA sends the PPDU based on the manner in which an LDPC extra symbol segment exists in operation S503, the LDPC extra symbol segment includes an extra symbol segment of a post-FEC padding type. Specifically, symbol segments used in the EHT include different types. A difference between a current implementation in which only an extra symbol segment of a pre-FEC padding type may be used in the EHT and the embodiment lies in that, in the embodiment, the LDPC extra symbol segment is further extended, so that the extra symbol segment of the post-FEC padding type may be used. This further improves communication efficiency.

Specifically, as shown in FIG. 5, a number of tones supported by each symbol in the EHT is approximately five times that in the HT. Therefore, in a current LDPC encoding process of the EHT, it is generally considered that data bits carried in a part of one symbol (for example, 1/4 symbol when a value of a is 1, 2/4 symbols when a value of a is 2, and 3/4 symbols when a value of a is 3) of the EHT are sufficient to accommodate data bits carried in one symbol of the HT. For example, an implementation in which the value of a is 1 in FIG. 5 is used as an example. A part of a 1/4 symbol (for example, a pre-FEC padding part in FIG. 5) is used as the extra symbol segment, and a remaining part (for example, a post-FEC padding part in FIG. 5) is generally not used to carry valid information, so that duration (that is, 3/4 symbols) corresponding to the post-FEC padding is reserved for a receive side, and more processing time is provided for a receiver.

However, in the foregoing implementation, the extra symbol segment is extended in a post-FEC padding manner. For example, when the extra symbol segment needs to be coded to generate the PPDU, $a_{init}$ and $N_{SYM,init}$ used in Formula (8) to Formula (12) are still equal to a and $N_{SYM}$ that are configured by the AP in the trigger frame, that is, the updating process in which 1 is subtracted from the value of $N_{SYM}$ or 1 is subtracted from the value of $a_{init}$ in Formula (14) does not need to be performed. In addition, in operation D, updating is always performed by using Formula (13), that is, the symbol segment is extended based on conditions that when a<4 (or $a_{init}$<4), a+1 (or $a_{init}$+1) and the symbol remains unchanged. In this way, the extra symbol segment may also be obtained.

In an embodiment, when a=4 (or $a_{init}$=4), the post-FEC padding does not exist, and the extra symbol segment may not be obtained by using this part. Therefore, when a=4 (or $a_{init}$=4), the extra symbol segment is not obtained by using the post-FEC padding.

In an embodiment, the LDPC extra symbol segment includes an extra symbol segment of a pre-FEC padding type.

Based on the embodiment shown in FIG. 10, after receiving the first PPDU from the STA, the AP may further determine, based on the fourth indication information in the first PPDU, whether a configuration manner of the first PPDU includes the LDPC extra symbol segment, so that the AP subsequently parses the first PPDU based on the fourth indication information. This improves a success rate of parsing the first PPDU on the AP side and further improves communication efficiency.

The foregoing describes the communication method provided in embodiments of this application. The following describes a communication apparatus provided in embodiments of this application.

FIG. 11 is a schematic diagram of a communication apparatus 1100 according to an embodiment of this application.

As shown in FIG. 11, the communication apparatus 1100 includes a transceiver unit 1101.

In an embodiment, the communication apparatus 1100 further includes a processing unit 1102.

In an embodiment, the transceiver unit 1101 is configured to perform a receiving or sending process of the communication apparatus 1100. Therefore, the transceiver unit 1101 may also be represented as a sending unit 11011 configured to perform the sending process of the communication apparatus 1100, and/or the transceiver unit 1101 may also be represented as a receiving unit 11012 configured to perform the receiving process of the communication apparatus 1100.

In an embodiment, the communication apparatus 1100 is configured to perform an implementation process of an AP in the foregoing embodiments of this application.

In some embodiments, the communication apparatus 1100 includes the sending unit 11011 and the receiving unit 11012.

The sending unit 11011 is configured to send first indication information, where the first indication information indicates a first RU of a STA.

The sending unit 11011 is further configured to send second indication information, where the second indication information indicates whether the STA is allowed to send a PPDU based on a part of the first RU, and when the second indication information indicates that the STA is allowed to send the PPDU based on the part of the first RU, the PPDU includes an LDPC extra symbol segment.

The receiving unit 11012 is configured to receive a first PPDU, where a second RU occupied by the first PPDU is the part of the first RU, and the first PPDU includes the LDPC extra symbol segment.

In some embodiments, the communication apparatus 1100 includes the transceiver unit 1101 and the processing unit 1102.

The processing unit 1102 is configured to generate a trigger frame, where the trigger frame includes the first indication information and third indication information, the first indication information indicates the first RU of the STA, and the third indication information indicates whether an LDPC extra symbol segment exists.

The transceiver unit 1101 is configured to send the trigger frame.

In some embodiments, the communication transceiver unit 1100 includes the transceiver unit 1101 and the processing unit 1102.

The processing unit 1102 is configured to generate the trigger frame, where the trigger frame includes the first indication information, and the first indication information indicates the first RU of the STA.

The transceiver unit 1101 is configured to receive the first PPDU based on the second RU that is determined by using the trigger frame, where the first PPDU includes the LDPC extra symbol segment, and the second RU is the part of the first RU.

It should be noted that the communication apparatus 1100 may be further configured to perform other embodiments performed by the AP in FIG. 1a to FIG. 10, and implement corresponding beneficial effects. For details, refer to the foregoing descriptions. Details are not described herein again.

In an embodiment, the communication apparatus 1100 is configured to perform an implementation process of the STA in the foregoing embodiments of this application.

In some embodiments, the communication apparatus 1100 includes the sending unit 11011 and the receiving unit 11012.

The receiving unit 11012 is configured to receive the first indication information, where the first indication information indicates the first RU of the STA.

The receiving unit 11012 is further configured to receive the second indication information, where the second indication information indicates whether the STA is allowed to send the PPDU based on the part of the first RU, and when the second indication information indicates that the STA is allowed to send the PPDU based on the part of the first RU, the PPDU includes the LDPC extra symbol segment.

The sending unit 11011 is configured to send the first PPDU based on the first indication information and the second indication information, where the second RU occupied by the first PPDU is the part of the first RU, and the first PPDU includes the LDPC extra symbol segment.

In some embodiments, the communication apparatus 1100 includes the transceiver unit 1101 and the processing unit 1102.

The transceiver unit 1101 is configured to receive the trigger frame, where the trigger frame includes the first indication information and the third indication information, the first indication information indicates the first RU of the STA, and the third indication information indicates whether an LDPC extra symbol segment exists.

The processing unit 1102 is configured to determine the second RU based on the trigger frame, where the second RU is the part of the first RU, and when the third indication information indicates that an LDPC extra symbol segment does not exist and when the first PPDU is sent based on the second RU, the first PPDU is a PPDU that does not require an LDPC extra symbol segment.

In some embodiments, the communication apparatus 1100 includes the transceiver unit 1101 and the processing unit 1102.

The transceiver unit 1101 is configured to receive the trigger frame, where the trigger frame includes the first indication information, and the first indication information indicates the first RU of the STA.

The processing unit 1102 is configured to send the first PPDU based on the second RU that is determined by using the trigger frame, where the first PPDU includes the LDPC extra symbol segment, and the second RU is the part of the first RU.

It should be noted that the communication apparatus 1100 may be further configured to perform other embodiments performed by the STA in FIG. 1a to FIG. 10, and implement corresponding beneficial effects. For details, refer to the descriptions in the foregoing embodiments. Details are not described herein again.

The foregoing describes the AP and the STA in embodiments of this application. The following describes example product forms of the AP and the STA. It should be understood that the following description is merely an example, and product forms of the AP and the STA in embodiments of this application are not limited thereto.

In a product form, the AP and STA in embodiments of this application may be implemented by using general bus architectures.

Figure 12:
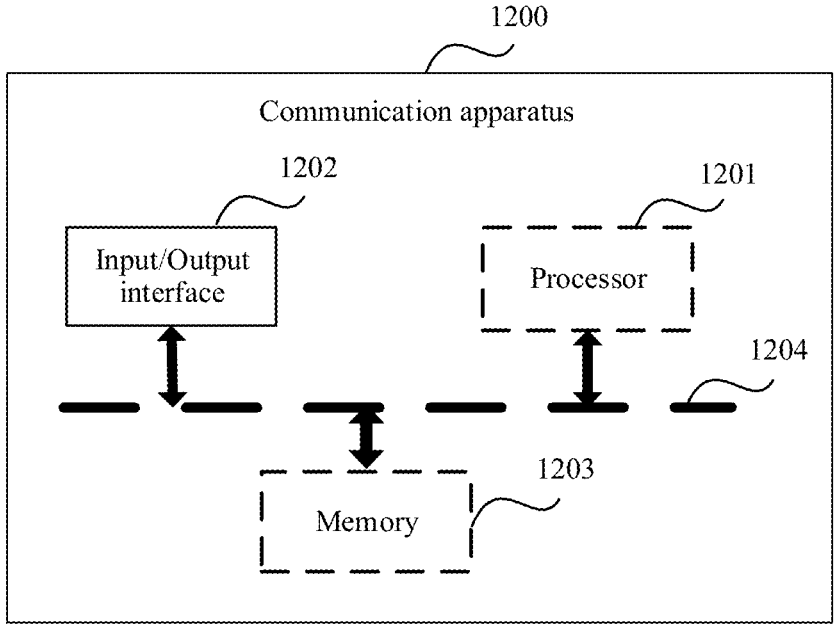
FIG. 12 is another schematic diagram of a communication apparatus according to this application.

For ease of description, FIG. 12 is a schematic diagram of a structure of a communication apparatus 1200 according to an embodiment of this application. The communication apparatus 1200 may be an AP, a STA, or a chip in the AP or the STA. FIG. 12 merely shows main components of the communication apparatus 1200. The communication apparatus 1200 includes at least an input/output port 1202.

In an embodiment, the input/output port 1202 may alternatively be referred to as a communication port, a communication interface, or the like.

In an embodiment, the communication apparatus 1200 further includes a processor 1201. In addition, the communication apparatus 1200 may further include a memory 1203.

In an embodiment, a bus 1204 may be further added to the apparatus 1200, and the bus 1204 is configured to establish a connection between the input/output port 1202 and/or memory 1203 and the processor 1201.

The processor 1201 is mainly configured to process a communication protocol and communication data, control the entire communication apparatus, execute a software program, and process data of the software program. The memory 1203 is mainly configured to store a software program and data. The input/output port 1202 may include a control circuit and an antenna. The control circuit is mainly configured to perform conversion between a baseband signal and a radio frequency signal and process the radio frequency signal. The antenna is mainly configured to receive and send radio frequency signals in a form of an electromagnetic wave. For example, the input/output port 1202 may be a touchscreen, a display, or a keyboard, and is mainly configured to receive data input by a user and output data to the user.

After the communication apparatus 1200 is powered on, the processor 1201 may read the software program in the memory 1203, interpret and execute instructions of the software program, and process data of the software program. When data needs to be sent in a wireless manner, the processor 1201 performs baseband processing on the to-be-sent data, and then outputs a baseband signal to a radio frequency circuit. The radio frequency circuit performs radio frequency processing on the baseband signal and then sends a radio frequency signal in a form of an electromagnetic wave by using the antenna. When data is sent to the communication apparatus, the radio frequency circuit receives a radio frequency signal by using the antenna, converts the radio frequency signal into a baseband signal, and outputs the baseband signal to the processor 1201. The processor 1201 converts the baseband signal into data, and processes the data.

In an embodiment, the memory 1203 may be located in the processor 1201.

In any one of the foregoing designs, the processor 1201 may include a communication interface for implementing a receiving function and a sending function. For example, the communication interface may be a transceiver circuit, an interface, or an interface circuit. The transceiver circuit, the interface, or the interface circuit configured to implement the receiving function and the sending function may be separated, or may be integrated together. The transceiver circuit, the interface, or the interface circuit may be configured to read and write code/data. Alternatively, the transceiver circuit, the interface, or the interface circuit may be configured to transmit or transfer a signal.

In any one of the foregoing designs, the processor 1201 may store instructions. The instructions may be a computer program. The computer program is run on the processor 1201, so that the communication apparatus 1200 performs the method described in any one of the foregoing embodiments. The computer program may be fixed in the processor 1201. In this case, the processor 1201 may be implemented by hardware.

In an implementation, the communication apparatus 1200 may include a circuit, and the circuit may implement a sending, receiving, or communication function in any one of the foregoing embodiments. The processor and the communication interface described in this application may be implemented on an integrated circuit (IC), an analog IC, a radio frequency integrated circuit (RFIC), a mixed signal IC, an application specific integrated circuit (ASIC), a printed circuit board (PCB), an electronic device, or the like. The processor and the communication interface may be manufactured using various IC technologies, for example, a complementary metal oxide semiconductor (CMOS), a negative channel metal oxide semiconductor (NMOS), a positive channel metal oxide semiconductor (PMOS), a bipolar junction transistor (BJT), a bipolar CMOS (BiC-MOS), silicon germanium (SiGe), and gallium arsenide (GaAs).

A scope of the communication apparatus described in this application is not limited thereto, and a structure of the communication apparatus may not be limited to the structure shown in FIG. 12. The communication apparatus may be an independent device or may be a part of a large device. For example, the communication apparatus may be as follows:

(1) an independent integrated circuit IC, a chip, or a chip system or subsystem;

(2) a set that includes one or more ICs, where in some embodiments, the set of ICs may further include a storage component configured to store data and a computer program;

(3) an ASIC, for example, a modem (Modem);

(4) a module that can be built in another device;

(5) a receiver, a terminal, an intelligent terminal, a cellular phone, a wireless device, a handheld device, a mobile unit, a vehicle-mounted device, a network device, a cloud device, an artificial intelligence device, or the like; or (6) others.

In a product form, the AP and STA in embodiments of this application may be implemented by using general-purpose processors.

It should be understood that the communication apparatuses in the foregoing various product forms have any function of the AP or STA in any one of the foregoing embodiments. Details are not described herein again.

An embodiment of this application further provides a computer-readable storage medium. The computer-readable storage medium stores computer program code. When the processor executes the computer program code, an electronic device performs the method in any one of the foregoing embodiments.

An embodiment of this application further provides a computer program product. When the computer program product is run on a computer, the computer is enabled to perform the method in any one of the foregoing embodiments.

An embodiment of this application further provides a communication apparatus. The apparatus may exist in a product form of a chip. A structure of the apparatus includes a processor and an interface circuit. The processor is configured to communicate with another apparatus through a receiver circuit, to enable the apparatus to perform the method in any one of the foregoing embodiments.

An embodiment of this application further provides a wireless communication system that includes an AP and a STA. The AP and the STA may perform the method in any one of the foregoing embodiments.

Method or algorithm operations described in combination with the content disclosed in this application may be implemented by hardware, or may be implemented by a processor by executing software instructions. The software instructions may include a corresponding software module. The software module may be stored in a random access memory (RAM), a flash memory, an erasable programmable read-only memory (EPROM), an electrically EPROM (EE-PROM), a register, a hard disk, a removable hard disk, a compact disc read-only memory (CD-ROM), or any other form of storage medium well-known in the art. For example, a storage medium is coupled to a processor, so that the processor can read information from the storage medium and write information into the storage medium. Certainly, the storage medium may be a component of the processor. The processor and the storage medium may be disposed in an ASIC.

A person skilled in the art should be aware that in the foregoing one or more examples, functions described in this application may be implemented by hardware, software, firmware, or any combination thereof. When the functions are implemented by software, the foregoing functions may be stored in a computer-readable medium or transmitted as one or more instructions or code in a computer-readable medium. The computer-readable medium includes a computer-readable storage medium and a communication medium. The communication medium includes any medium that transfers a computer program from one place to another. The storage medium may be any available medium accessible to a general-purpose or a dedicated computer.

In the foregoing embodiments, the objectives, technical solutions, and beneficial effects of this application are further described in detail. It should be understood that the foregoing descriptions are merely embodiments of this application, but are not intended to limit the protection scope of this application. Any modification, equivalent replacement, improvement, or the like made based on the technical solutions of this application shall fall within the protection scope of this application.

What is claimed is:

1. A communication method, comprising:

sending, by an access point (AP), first indication information, wherein the first indication information indicates a first resource unit (RU) of a station (STA);

sending, by the AP, second indication information, wherein the second indication information indicates whether the STA is allowed to send a physical layer protocol data unit (PPDU) based on a part of the first RU, and when the second indication information indicates that the STA is allowed to send the PPDU based on the part of the first RU, the PPDU comprises a low density parity check (LDPC) extra symbol segment; and receiving, by the AP, a first PPDU, wherein a second RU occupied by the first PPDU is the part of the first RU, and the first PPDU comprises the LDPC extra symbol segment of a padding type.

2. The method according to claim 1, wherein the first indication information is carried in a trigger frame, the trigger frame further comprises third indication information, and the third indication information indicates that an LDPC extra symbol segment exists.

3. The method according to claim 2, wherein the trigger frame is carried in a second PPDU, and the second indication information is carried in the second PPDU.

4. A communication method, comprising:

receiving, by a station (STA), first indication information, wherein the first indication information indicates a first resource unit (RU) of the STA;

receiving, by the STA, second indication information indicating whether the STA is allowed to send a physical layer protocol data unit (PPDU) based on a part of the first RU, and when the second indication information indicates that the STA is allowed to send the PPDU based on the part of the first RU, the PPDU comprises a low density parity check (LDPC) extra symbol segment; and sending, by the STA, a first PPDU based on the first indication information and the second indication information, wherein a second RU occupied by the first PPDU is the part of the first RU, and the first PPDU comprises the LDPC extra symbol segment of a padding type.

5. The method according to claim 4, wherein the first indication information is carried in a trigger frame, the trigger frame further comprises third indication information, and the third indication information indicates that an LDPC extra symbol segment exists.

6. The method according to claim 5, wherein the trigger frame is carried in a second PPDU, and the second indication information is carried in the second PPDU.

7. A communication apparatus, comprising a sending unit and a receiving unit, wherein the sending unit is configured to send first indication information, wherein the first indication information indicates a first resource unit (RU) of a station (STA);

the sending unit is further configured to send second indication information, wherein the second indication information indicates whether the STA is allowed to send a physical layer protocol data unit (PPDU) based on a part of the first RU, and when the second indication information indicates that the STA is allowed to send the PPDU based on the part of the first RU, the PPDU comprises a low density parity check (LDPC) extra symbol segment; and the receiving unit is configured to receive a first PPDU, wherein a second RU occupied by the first PPDU is the part of the first RU, and the first PPDU comprises the LDPC extra symbol segment of a padding type.

8. The apparatus according to claim 7, wherein the first indication information is carried in a trigger frame, the trigger frame further comprises third indication information, and the third indication information indicates that an LDPC extra symbol segment exists.

9. The apparatus according to claim 8, wherein the trigger frame is carried in a second PPDU, and the second indication information is carried in the second PPDU.

* * * * *